United States Patent
Ishihara et al.

(10) Patent No.: US 11,303,266 B2
(45) Date of Patent: Apr. 12, 2022

(54) ELECTRONIC CIRCUIT AND ELECTRONIC APPARATUS

(71) Applicant: KABUSHIKI KAISHA TOSHIBA, Tokyo (JP)

(72) Inventors: Hiroaki Ishihara, Yokohama (JP); Satoshi Takaya, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 17/187,414

(22) Filed: Feb. 26, 2021

(65) Prior Publication Data

US 2022/0069806 A1 Mar. 3, 2022

(30) Foreign Application Priority Data

Sep. 1, 2020 (JP) .............................. JP2020-146994

(51) Int. Cl.
*H03K 3/011* (2006.01)
*G06F 1/08* (2006.01)
*H03K 5/00* (2006.01)
*H03D 7/00* (2006.01)

(52) U.S. Cl.
CPC .............. *H03K 3/011* (2013.01); *G06F 1/08* (2013.01); *H03K 5/00006* (2013.01); *H03D 7/00* (2013.01)

(58) Field of Classification Search
CPC ...... H03K 3/011; H03K 5/00006; G06F 1/08; H03D 7/00

USPC ......................................................... 327/291
See application file for complete search history.

(56) References Cited

U.S. PATENT DOCUMENTS

| 8,378,663 B2 * | 2/2013 | Cadoux ................. G01R 19/18 |
| | | 324/127 |
| 2021/0075410 A1 * | 3/2021 | Takaya ................... G01R 15/16 |

FOREIGN PATENT DOCUMENTS

| JP | 9-326645 A | 12/1997 |
| JP | 2021-42996 A | 3/2021 |
| WO | WO2015/119087 A1 | 8/2015 |

\* cited by examiner

*Primary Examiner* — Tomi Skibinski
(74) *Attorney, Agent, or Firm* — Oblon, McClelland, Maier & Neustadt, L.L.P.

(57) ABSTRACT

An electronic circuit according to the embodiment of the present invention includes a first circuit, a second circuit electrically insulated from the first circuit, and a transmitter transmitting a signal between the first and the second circuits. The first circuit receives an input signal, generates a first reference signal, and converts frequencies of the input signal and the first reference signal. The transmitter transmits the frequency-converted input signal and first reference signal to the second circuit. The second circuit converts the frequencies of the transmitted input signal first reference signal to obtain a restored input signal and a restored first reference signal, generates a second reference signal, calculates a gain to be adjusted of the restored input signal based on the restored first reference signal and the second reference signal to adjust the gain of the restored input signal.

20 Claims, 20 Drawing Sheets

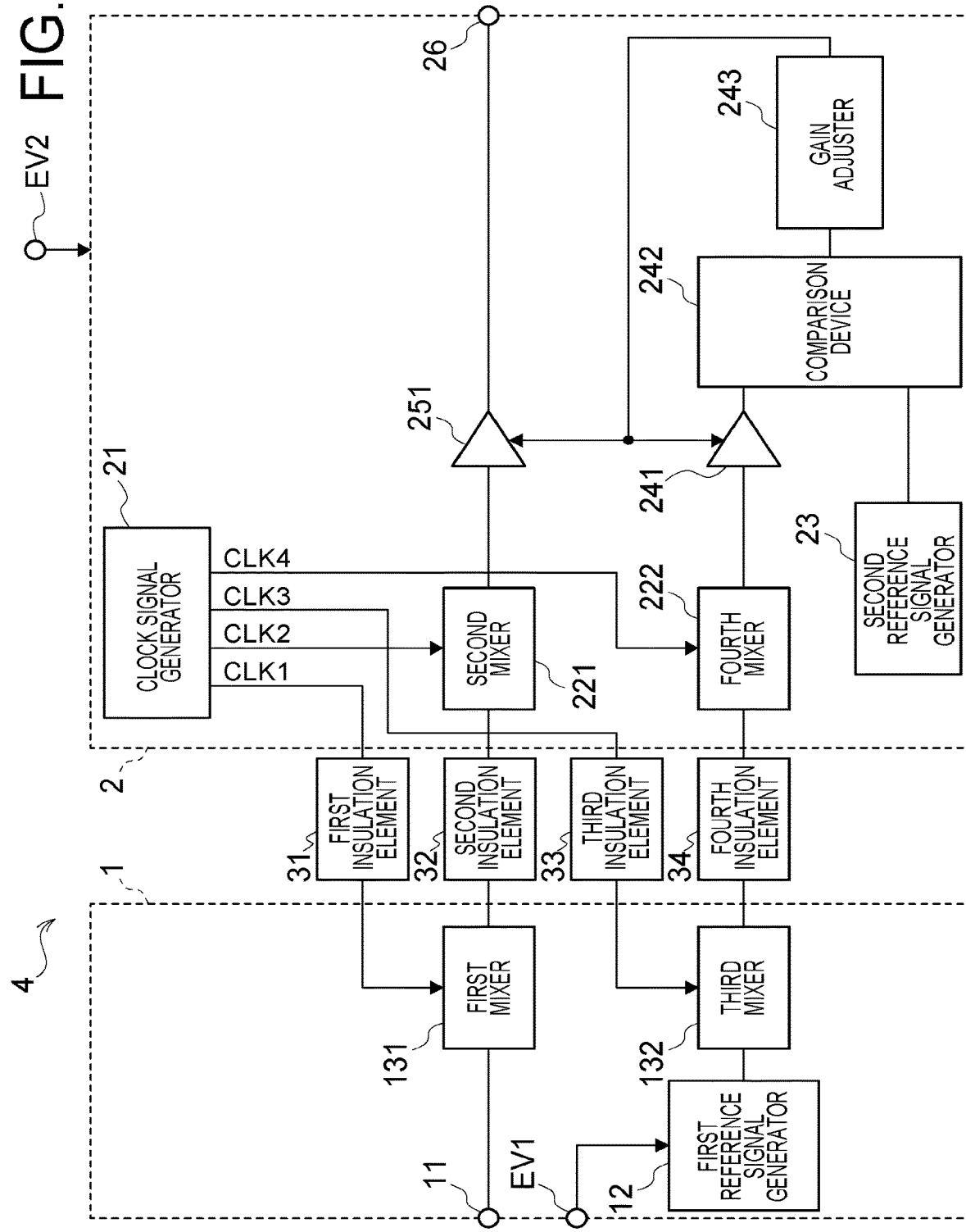

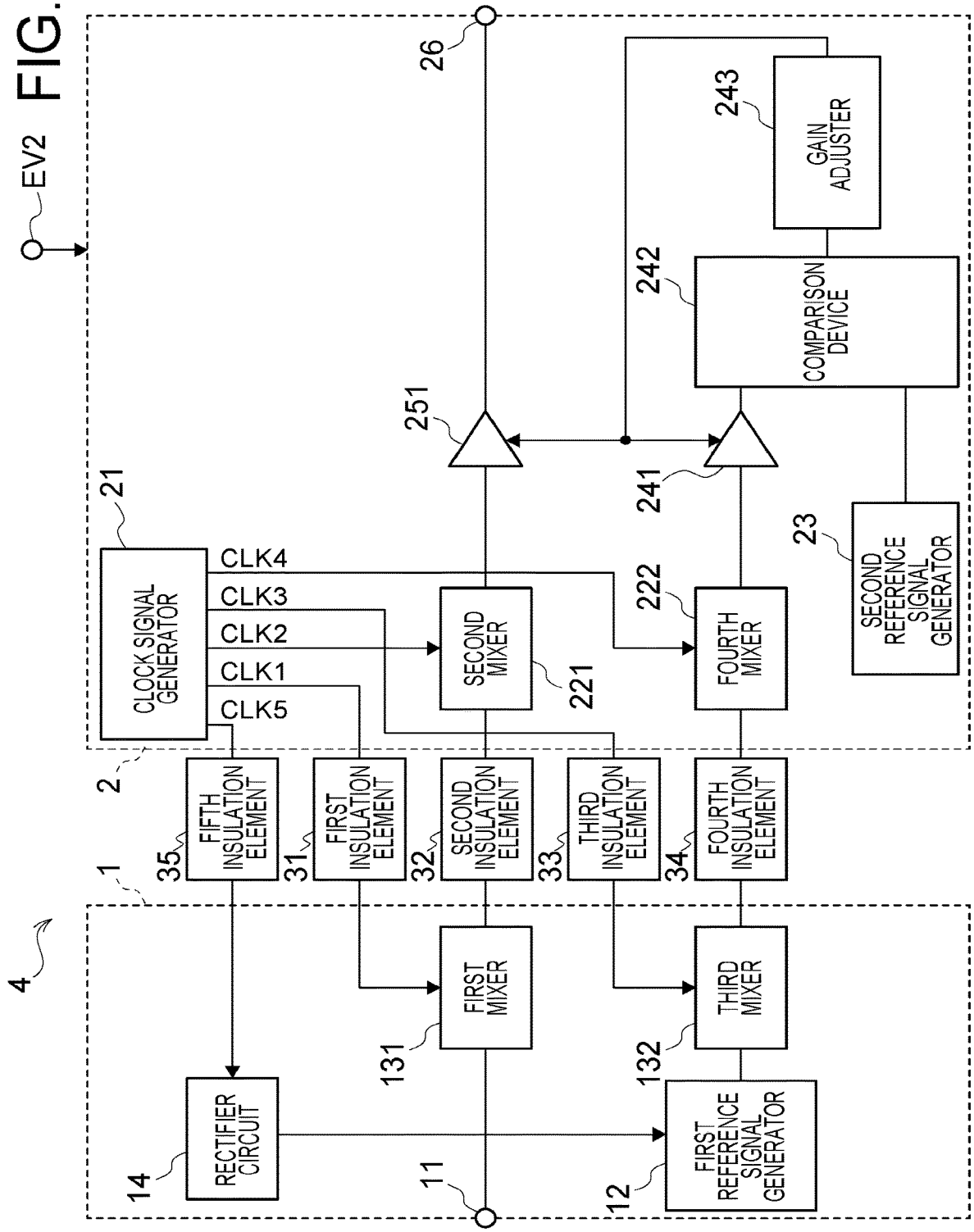

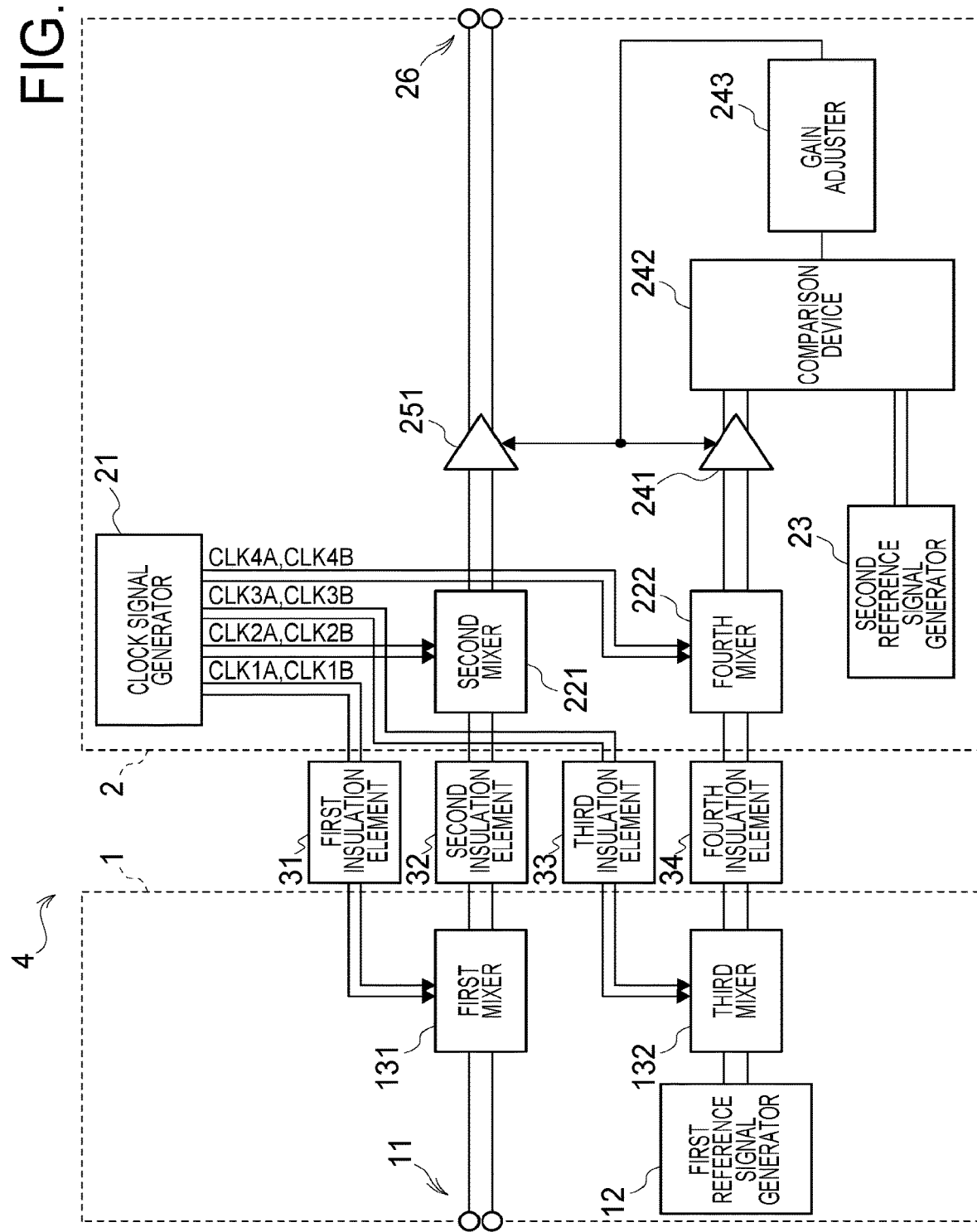

ELECTRONIC CIRCUIT AND ELECTRONIC APPARATUS

CROSS-REFERENCE TO RELATED APPLICATION (S)

This application is based upon and claims the benefit of priority from Japanese Patent Application No. 2020-146994, filed Sep. 1, 2020; the entire contents of which are incorporated herein by reference.

FIELD

An embodiment relates to an electronic circuit and an electronic apparatus.

BACKGROUND

In an electronic circuit, electric insulation is required for various purposes such as improvement of safety, prevention of damage, and noise reduction. In this case, it is necessary to perform signal transmission between two partial circuits electrically insulated while maintaining the electric insulation. In a case where an analog signal is transmitted, for example, there is a method in which the analog signal is once up-converted into a high-frequency signal, the high-frequency signal is transmitted through a transmission device, and a reception side down-converts the high-frequency signal to restore an original signal. In an integrated circuit, however, it is difficult to maintain a gain in up-conversion and down-conversion, a passage gain of an insulation device providing insulation, and other gains constant with high accuracy. Therefore, the gains are varied by manufacturing variation, temperature change, voltage change, and other factors. In a case where accurate comprehension of an analog amount is required, it is necessary to ensure an absolute value of each of the gains with high accuracy, and variation of these gains are not allowed.

BRIEF DESCRIPTION OF THE DRAWINGS

FIG. 4 is a diagram illustrating a first example of a power supply path;

FIG. 5 is a diagram illustrating a second example of the power supply path;

FIG. 7 is a diagram illustrating a configuration example in a case of a differential signal channel;

DETAILED DESCRIPTION

An electronic circuit according to an embodiment of the present invention enables gain adjustment when converting an analog signal into a high-frequency signal and transmitting the high-frequency signal between insulated circuits. The electronic circuit comprises a first circuit, a second circuit electrically insulated from the first circuit, and a transmitter configured to transmit signals between the first circuit and the second circuit. The first circuit includes an input terminal receiving an analog input signal, a first reference signal generator generating an analog first reference signal, and a first frequency converter converting a frequency of the analog input signal and a frequency of the analog first reference signal. The transmitter transmits the frequency-converted input signal and the frequency-converted first reference signal from the first circuit to the second circuit. The second circuit includes: a second frequency converter converting the frequency of the transmitted input signal and the frequency of the transmitted first reference signal to obtain a restored input signal and a restored first reference signal; a second reference signal generator generating an analog second reference signal; a gain calculator calculating a gain to be adjusted of the restored input signal based on the restored first reference signal and the analog second reference signal; a gain adjustment device adjusting the gain of the restored input signal based on the calculated gain; and an output terminal outputting the gain-adjusted input signal.

An embodiment will be explained in detail below with reference to the accompanying drawings. The present invention is not limited to the embodiment.

(One Embodiment of Present Invention)

Figure 1:
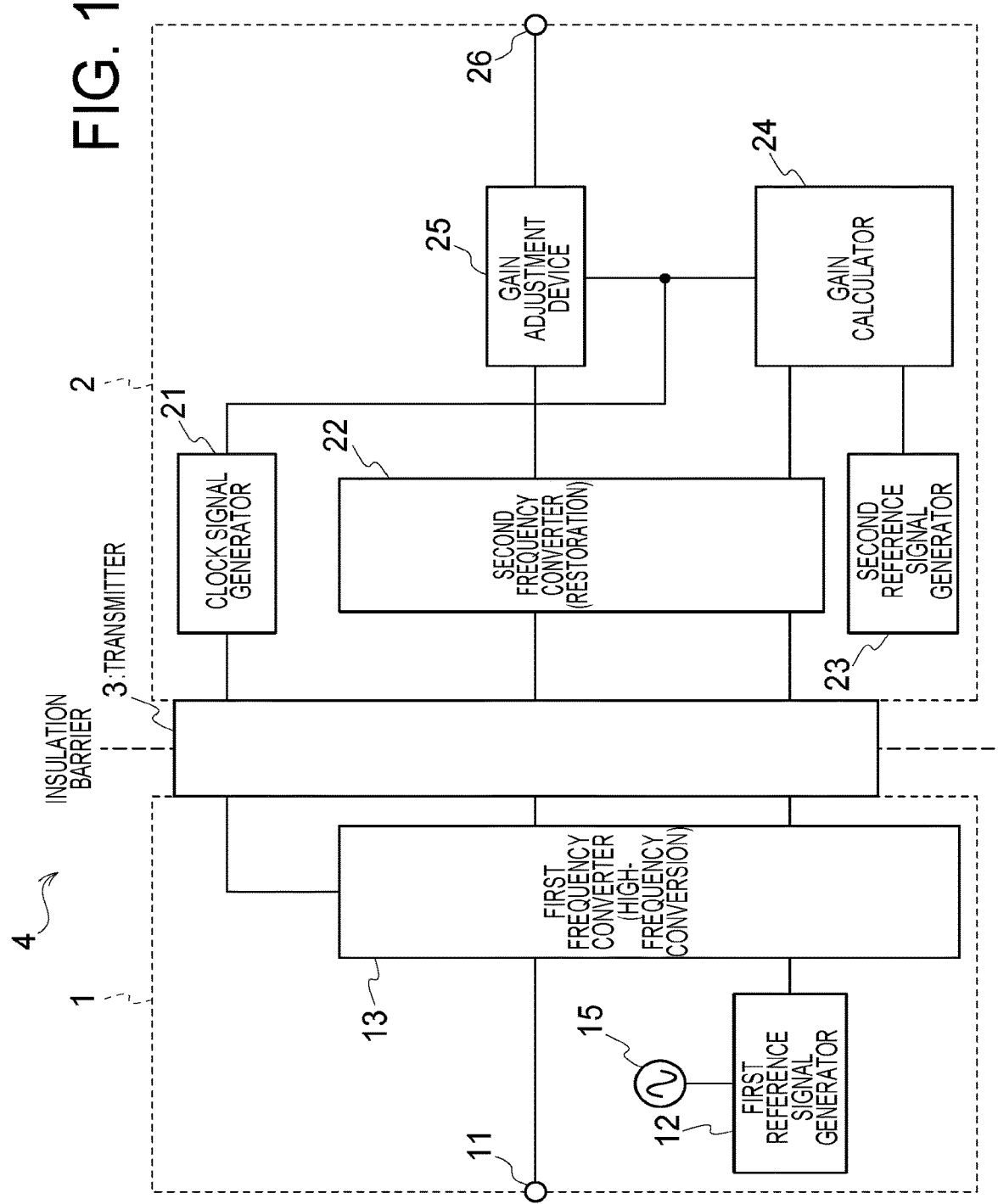
FIG. 1 is a block diagram of an electronic circuit according to an embodiment of the present invention.

FIG. 1 is a block diagram of the electronic circuit according to the embodiment of the present invention. In the present embodiment, an electronic circuit 4 including a first partial circuit 1, a second partial circuit 2, and a transmitter 3 is illustrated. The first partial circuit 1 includes an input terminal 11, a first reference signal generator 12, and a first frequency converter 13. The second partial circuit 2 includes a clock signal generator 21, a second frequency converter 22, a second reference signal generator 23, a gain calculator 24, a gain adjustment device 25, and an output terminal 26.

As described below, processing performed by the gain adjustment device 25 may become unnecessary depending on processing performed by the clock signal generator 21. In this case, the gain adjustment device 25 may be omitted. In this case, the clock signal generator 21 serves also as the gain adjustment device 25.

In the electronic circuit 4, the first partial circuit 1 and the second partial circuit 2 are electrically insulated from each other for design reasons. An insulating method is not particularly limited. A gap may be provided between the first partial circuit 1 and the second partial circuit 2, and the first partial circuit 1 and the second partial circuit 2 may be physically separated. The gap may be hollow or filled with an insulator. Alternatively, the electronic circuit 4 may be logically separated into the first partial circuit 1 and the second partial circuit 2 by an insulator made of a resin, etc. In other words, an insulation barrier is provided inside the electronic circuit 4. Out of regions separated by the insulation barrier, a region including the input terminal 11 is referred to as the first partial circuit 1, and the other region is referred to as the second partial circuit 2. In the present embodiment, the insulation barrier is included in a part of the transmitter 3.

When an alternating current, namely, an analog signal is input to the input terminal 11 of the first partial circuit 1, the electronic circuit 4 transmits the analog signal through the transmitter 3 while maintaining the insulation, and outputs the analog signal from the output terminal 26 of the second partial circuit 2.

Further, the electronic circuit 4 ensures accuracy of a signal gain of the analog signal from the input terminal 11 to the output terminal 26. For example, an isolation amplifier that can be realized by the electronic circuit 4 is used in an application in which an absolute value of a signal is important, and it is necessary to ensure accuracy of the absolute values of the input signal and the output signal of the isolation amplifier. Therefore, in the electronic circuit 4, difference between the signal gain of the analog signal that is input to the input terminal 11 and output from the output terminal 26 and a preset prescribed signal gain is settled within an allowable range. Therefore, the first partial circuit 1 and the second partial circuit 2 include the components as illustrated in FIG. 1.

For example, the electronic circuit 4 may be realized by using an integrated circuit, the first partial circuit 1 and the transmitter 3 may be integrated on one chip, the second partial circuit 2 may be integrated on one chip, and both chips may be connected through a bonding wire, etc. Alternatively, the first partial circuit 1 may be integrated on one chip, the second partial circuit 2 and the transmitter 3 are integrated on one chip, and both chips may be connected through a bonding wire, etc. Further alternatively, the first partial circuit 1, the second partial circuit 2, and the transmitter 3 are integrated on respective individual chips, and the chips may be connected through bonding wires, etc.

The components of the first partial circuit 1 and the second partial circuit 2 are not necessarily integrated on one chip, and may be arranged over a plurality of chips. Further, a part or all of the components of the first partial circuit 1 and the second partial circuit 2 may be realized by circuit elements other than the integrated circuit. Furthermore, the transmitter 3 may be not integrated on a chip, and may be realized by a capacitor or a transformer that has desired withstand voltage characteristics and can transmit a signal through electromagnetic field coupling. For example, a capacitor or a transformer in a flexible substrate or a printed circuit board (PCB) may be used.

Each of the components of the electronic circuit 4 illustrated in FIG. 1 may have various internal configurations. Possible configurations are illustrated with reference to FIG. 2 and subsequent drawings. The internal configuration of the electronic circuit 4, however, is not limited to the configuration examples in FIG. 2 and subsequent drawings. The internal configurations illustrated in FIG. 2 and subsequent drawings may be combined. In other words, an example in which the internal configurations illustrated in FIG. 2 and subsequent drawings are combined is available.

Processing performed by the components illustrated in FIG. 1 is briefly described. A specific example of each processing is described in illustration of FIG. 2 and subsequent drawings. The input terminal 11 receives input of the analog signal.

In this description, a signal input to the input terminal 11 is referred to as an input signal. The input signal is varied in frequency, gain, etc. by the processing of each of the components, and is finally output as an output signal from the output terminal 26. Accordingly, the output signal is the input signal processed by the components.

The first reference signal generator 12 generates an analog first reference signal. The first reference signal is used to adjust a gain of the input signal.

The first frequency converter 13 converts frequencies of the analog input signal and the analog first reference signal. In other words, the analog input signal and the analog first reference signal are converted into high-frequency signals. The conversion allows for transmission by the transmitter 3. Although each of the high-frequency signals is assumed to have a frequency of several hundred kHz or more, it is sufficient for each of the high-frequency signals to have a frequency transmittable by the transmitter 3.

The frequency conversion by the first frequency converter 13 is performed based on a clock signal generated by the clock signal generator 21.

The transmitter 3 transmits the frequency-converted input signal and the frequency-converted first reference signal to the second partial circuit 2. To maintain the electric insulation, the transmitter 3 is assumed to use an element that can transmit the high-frequency signal, such as the capacitor and the transformer as described above. To enhance insulation property, a plurality of elements may be connected in series.

The second frequency converter 22 converts the frequencies of the transmitted input signal and the transmitted first reference signal to restore the input signal and the first reference signal. In other words, the second frequency converter 22 returns the frequencies of the input signal and the first reference signal to the frequencies of the analog signals before conversion by the first frequency converter 13. Gains of the restored input signal and the restored first reference signal, however, may be different from the gains before conversion due to at least one of the frequency conversions by the first frequency converter 13, the transmission by the transmitter 3, and the frequency conversion by the second frequency converter 22. Therefore, it is necessary to adjust the gains.

The second reference signal generator 23 generates an analog second reference signal. The gain calculator 24 calculates a gain to be adjusted of the restored input signal based on the restored first reference signal and the analog second reference signal. The gain adjustment device 25 adjusts the gain of the restored input signal based on the calculated gain. As a result, the difference between the adjusted gain of the input signal and the preset prescribed signal gain is settled within the allowable range. This is because the second reference signal is not subjected to frequency conversion and transmission, and the gain of the second reference signal is not changed. The gain adjusted input signal is output through the output terminal 26.

As described above, since the clock frequency influences on the gain, the gain can be changed by changing the clock frequency. In other words, adjusting the clock frequency makes it possible to adjust the gain of the input signal to a desired value. Accordingly, the gain calculated by the gain calculator 24 may be input to the clock signal generator 21 without being input to the gain adjustment device 25, and the clock signal generator 21 may adjust the clock frequency based on the gain. Alternatively, the gain calculated by the gain calculator 24 may be input to both of the clock signal generator 21 and the gain adjustment device 25, and both of adjustment of the clock frequency and adjustment of the gain of the restored input signal may be performed. For example, the gain adjustment device 25 and the clock signal generator 21 may be properly used based on a control stage such that the gain adjustment device 25 adjusts the gain until deviation of the gain becomes less than or equal to a predetermined threshold, and the clock signal generator 21 adjusts the gain after the deviation of the gain becomes less than or equal to the predetermined threshold.

As described above, in the electronic circuit according to the present embodiment, the analog signal is converted into the high-frequency signal and the high-frequency signal is transmitted between the insulated circuits, and the gain is then calibrated with high accuracy. This makes it possible to ensure the gain with high accuracy.

(First Internal Configuration Example)

Figure 2:
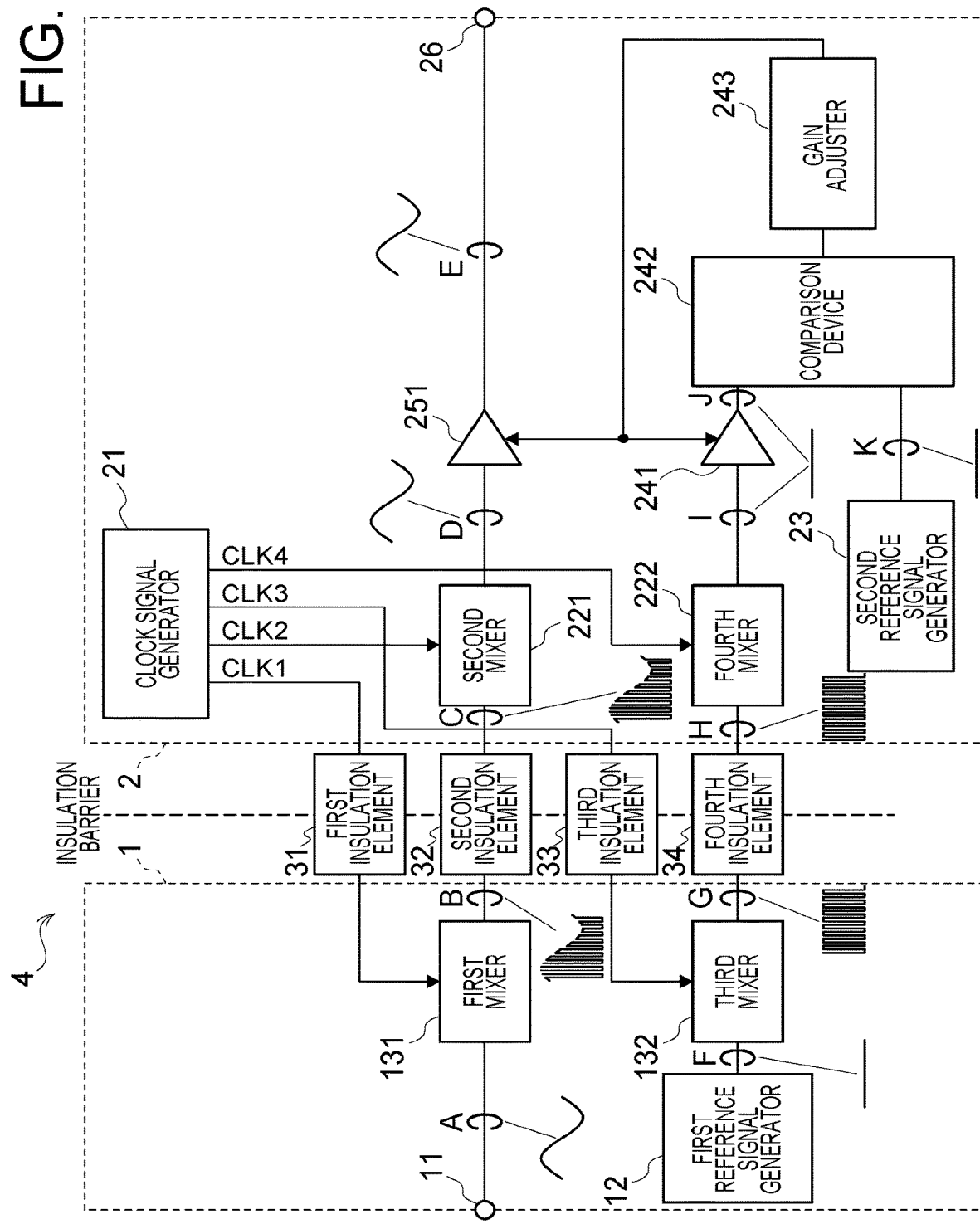
FIG. 2 is a diagram illustrating a configuration example of the electronic circuit.

A possible internal configuration of each of the components of the electronic circuit 4 is illustrated. FIG. 2 is a diagram illustrating a configuration example of the electronic circuit 4. In the example of FIG. 2, the first frequency converter 13 includes a first mixer 131 and a third mixer 132. The transmitter 3 includes a first insulation element 31, a second insulation element 32, a third insulation element 33, and a fourth insulation element 34. The second frequency converter 22 includes a second mixer 221 and a fourth mixer 222. The gain calculator 24 includes a first variable gain device 241, a comparison device 242, and a gain adjuster 243. The gain adjustment device 25 is realized by a second variable gain device 251.

Further, in the present example, the clock signal generator 21 generates a first clock signal CLK1, a second clock signal CLK2, a third clock signal CLK3, and a fourth clock signal CLK4. The first clock signal CLK1 is transmitted to the first partial circuit 1 through the first insulation element 31, and is input to the first mixer 131. The second clock signal CLK2 is input to the second mixer 221. The third clock signal CLK3 is transmitted to the first partial circuit 1 through the third insulation element 33, and is input to the third mixer 132. The fourth clock signal CLK4 is input to the fourth mixer 222. In the following, the clock signals are also simply denoted only by reference signs.

FIG. 2 further illustrates waveforms of signals at points A to K. An input signal having a waveform at the point A in FIG. 2 is input to the input terminal 11. The first mixer 131 converts the frequency of the input signal to generate the high-frequency signal. The input signal converted into the high-frequency signal has a waveform, for example, as illustrated at the point B in FIG. 2. The converted frequency of the input signal corresponds to a frequency of the first clock signal.

The first mixer 131 may use the first clock signal as driving power. The first clock signal is transmitted from the second partial circuit 2, which makes it possible to eliminate necessity of arranging a power supplier driving the first mixer 131 in the first partial circuit 1. Even in a case where the power supplier is arranged in the first partial circuit 1, a load of the power supplier is reduced, which makes it possible to downsize the power supplier of the first partial circuit 1.

The input signal converted into the high-frequency signal is transmitted by the second insulation element 32, and is input to the second mixer 221. The transmitted input signal has a waveform, for example, at the point C in FIG. 2. The input signal converted into the high-frequency signal by the first mixer 131 is restored, by the second mixer 221, to the input signal before becoming the high-frequency signal. The restored input signal has a waveform, for example, at the point D in FIG. 2.

The second mixer 221 actually converts the frequency of the input signal converted into the high-frequency signal, into a frequency corresponding to the second clock signal CLK2. To convert the frequency to the original frequency, the frequencies of the first clock signal CLK1 and the second clock signal CLK2 are previously determined such that the frequency of the input signal converted by the second mixer 221 is coincident with the frequency of the input signal at the time when the input signal is input to the input terminal 11.

The input signal restored by the second mixer 221 is input to the second variable gain device 251, and the gain of the restored input signal is adjusted by the second variable gain device 251. Thereafter, the gain-adjusted input signal is output as an output signal from the output terminal 26. The output signal has a waveform, for example, at the point E in FIG. 2.

The representative variation factors influencing on the characteristics of the electronic circuit are manufacturing variation, power supply voltage fluctuation, temperature fluctuation, etc. In the configuration example of FIG. 2, for example, a conversion gain of each of the mixers, a transmission gain of each of the insulation elements, a gain of each of the variable gain devices, and the frequencies of the clock signals may influence on the gain of the output signal, and these factors are also influenced by the manufacturing variation, the power supply voltage fluctuation, the temperature fluctuation, etc. For example, the conversion gain of each of the mixers is also influenced by an amplitude of the input clock signal, the power supply voltage, etc. The signal transfer characteristics of each of the variable gain devices may be fluctuated by the power supply voltage, the temperature, etc. The transfer characteristics of each of the insulation elements also depend on the frequency of the corresponding clock signal, the temperature, the power supply voltage, etc. Further, the signal transfer characteristics are varied due to the manufacturing variation at any of the above-described positions. As described above, since the input signal receives various influences until being output as the output signal, the input signal is output after the gain is adjusted.

The gain adjustment is described below. The first reference signal generator 12 generates an analog signal of a first reference voltage, and the second reference signal generator 23 generates an analog signal of a second reference voltage. The analog signal generated by the first reference signal generator 12 is referred to as the first reference signal, and the analog signal generated by the second reference signal generator 23 is referred to as the second reference signal. The first reference voltage and the second reference voltage are previously determined such that accuracy of a ratio of the first reference voltage and the second reference voltage becomes greater than or equivalent to accuracy required for the difference between the gain of the input signal and the prescribed signal gain. For example, in an integrated circuit, a forward-direction voltage "$V_f$" of a diode element, a voltage "$V_{BE}$" between a base and an emitter of a bipolar transistor, or other voltages may be used as the first reference voltage and the second reference voltage. These elements each have dependency on the temperature. The ratio of the first reference voltage and the second reference voltage is varied based on the temperature difference between the first reference signal generator 12 and the second reference signal generator 23. In a case where the ratio is settled within the allowable range even after being varied, the first reference signal generator 12 and the second reference signal generator 23 may be configured by using these elements having temperature dependency. In contrast, in a case where the maximum temperature difference between the two reference signal generators is large, and the desired accuracy cannot be achieved by the elements having the temperature dependency because the maximum temperature difference cannot be predicted, the first reference signal generator 12 and the second reference signal generator 23 are preferably configured by using an element having small temperature dependency, such as a band gap reference. Further, in a case where the difference between the first reference voltage and the second reference voltage is unacceptably increased by the manufacturing variation, the manufacturing variation may be corrected by trimming or the like.

The first reference signal may have, for example, a direct current waveform at the point F in FIG. 2. The first reference signal is input to the third mixer 132. The third mixer 132 converts the frequency of the first reference signal into a frequency corresponding to the third clock signal CLK3 transmitted through the third insulation element 33, thereby converting the first reference signal into the high-frequency signal. For example, the resultant signal has a waveform at the point G in FIG. 2.

As with the first mixer 131, the third mixer 132 may use the third clock signal as the driving power. The third clock signal is transmitted from the second partial circuit 2, which makes it possible to eliminate necessity of arranging a power supplier driving the third mixer 132 in the first partial circuit 1. Even in a case where the power supplier is arranged in the first partial circuit 1, a load of the power supplier of the first partial circuit 1 is reduced, which makes it possible to downsize the power supplier.

The first reference signal converted into the high-frequency signal by the third mixer 132 is transmitted through the fourth insulation element 34, and is input to the fourth mixer 222. The transmitted first reference signal has, for example, a waveform at the point H in FIG. 2. The fourth mixer 222 converts the frequency of the transmitted first reference signal into a frequency corresponding to the fourth clock signal CLK4. As a result, the first reference signal is converted from the high-frequency signal into the analog signal, the frequency of which is restored to the frequency at generation by the first reference signal generator 12. The restored first reference signal has, for example, a waveform at the point I in FIG. 2. The restored first reference signal is input to the comparison device 242 through the first variable gain device 241. The first reference signal input to the comparison device 242 has, for example, a waveform at the point J in FIG. 2.

The electronic circuit 4 is configured such that variation of the gain of the input signal until the input signal is input to the second variable gain device 251 and variation of the gain of the first reference signal until the first reference signal is input to the first variable gain device 241 are substantially equal to each other. For example, the first mixer 131 and the third mixer 132 are configured so as to have the same configuration or to be replicas having a fixed size ratio. This is true of a combination of the second mixer 221 and the fourth mixer 222, a combination of the first insulation element 31 and the third insulation element 33, and a combination of the second insulation element 32 and the fourth insulation element 34. Further, the first variable gain device 241 and the second variable gain device 251 are designed so as to have the same gain or a fixed gain ratio. The clock signals CLK1, CLK2, CLK3, and CLK4 have the same frequency. The gain of the first variable gain device 241 is defined as "Av1", the gain of the second variable gain device 251 is defined as "Av2", and the ratio thereof is defined as Av1/Av2=K, where "K" is a known value determined in design.

A case where the gain from the input terminal 11 to the output terminal 26 is corrected to a prescribed value "A0" is described. In this case, when the gain from the point F to the point 3 is "B", the gain from the point A to the point E can be controlled to B×K=A0 by performing adjustment to establish B=A0/K. The restored first reference signal from the fourth mixer 222 and the second reference signal from the second reference signal generator 23 are input to the comparison device 242. The second reference signal has, for example, a waveform at the point K in FIG. 2. The comparison device 242 compares the two input signals, and outputs a result of the comparison.

The result of the comparison is determined in the following manner, for example. The voltage of the first reference signal from the first reference signal generator 12 is defined as "$V_{ref1}$", and the voltage of the second reference signal from the second reference signal generator 23 is defined as "$V_{ref2}$". The first reference signal generator 12 and the second reference signal generator 23 are designed to cause a ratio of the two voltages to be a predetermined value "a" (=$V_{ref1}/V_{ref2}$). When the gain from the point F from the point J is defined as "B", the two inputs to the comparison device 242 are "B×$V_{ref1}$" and "$V_{ref2}$", and the ratio thereof is B×$V_{ref1}/V_{ref2}$=α×B. Since the value "a" is known, the gain "B" from the point F to the point J can be estimated by comparing the two input signals by the comparison device 242. The comparison device 242 outputs a signal corresponding to magnitude relationship of the estimated value "B" and a target value "A0/K" determined based on the prescribed gain "A0". Note that the target value "A0/K" is defined as "B0" (A0/K=B0).

The output of the comparison device 242 is input to the gain adjuster 243. The gain adjuster 243 determines the gains of the first variable gain device 241 and the second variable gain device 251 based on the output of the comparison device 242. For example, in a case where the gain "B" is greater than the target value "B0", the gain is adjusted to be reduced. In a case where the gain "B" is less than the target value "B0", the gain is adjusted to be increased. As a method of adjusting the gain, an optional algorism such as a hill-climbing method and a successive comparison method may be used. The gain "B" is controlled so as to be coincident with the target value "B0" in the above-described manner. The gain of the first variable gain device 241 is adjusted such that the ratio "Av1/Av2" becomes constant by the output of the gain adjuster 243. Making the gain "B" coincident with the target value "B0" by this configuration makes it possible to adjust the gain "A" from the input terminal 11 to the output terminal 26 to the prescribed value "A0".

As described above, the configuration illustrated in FIG. 2 enables adjustment such that the gain from the input terminal 11 to the output terminal 26 is constantly coincident with the prescribed value irrespective of the variation factors such as the manufacturing variation, the temperature, and the power supply voltage.

In the configuration example of FIG. 2, in a case where a phase difference generated in a channel of each of the clock signals, the input signal, and the first reference signal influences on the characteristics, the clock signal generator 21 may change the phase of each of the clock signals in order to correct the influence. Further, in the example of FIG. 2, the clock signals are defined as signals independent of one another; however, in a case where the influence of the phase difference on the characteristics is allowable, all or some of the clock signals may be a common clock signal, and the common clock signal may be distributed.

(Second Internal Configuration Example)

Each of the first reference signal generator 12 and the second reference signal generator 23 also can have various internal configurations. Possible internal configurations are illustrated. FIGS. 3A to 3D are diagrams each illustrating an example of the internal configuration of each of the first reference signal generator 12 and the second reference signal generator 23. As described above, in the case where the temperature dependency is allowable, a diode illustrated in each of FIG. 3A to FIG. 3C may be used, and the voltage "$V_f$" of the diode and the voltage "$V_{BE}$" of the bipolar transistor may be used as the first reference signal and the second reference signal. In place of the diode, for example, an NPN transistor in which a base and a collector are connected may be used.

Figure 3A:
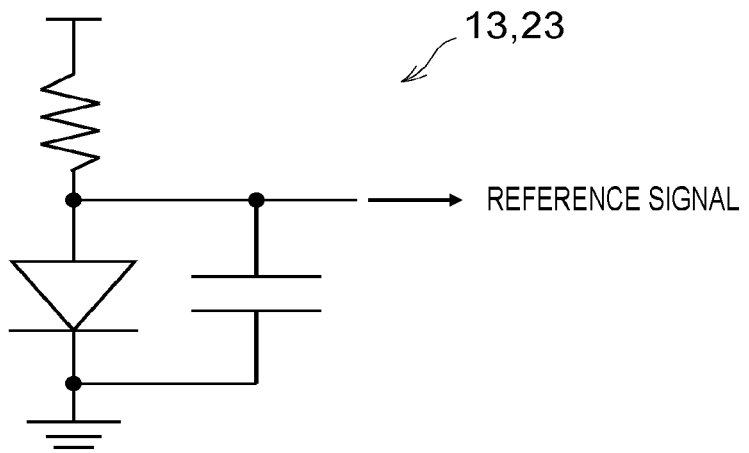
FIGS. 3A to 3D are diagrams each illustrating an internal configuration of each of a first reference signal generator and a second reference signal generator.
Figure 3B:
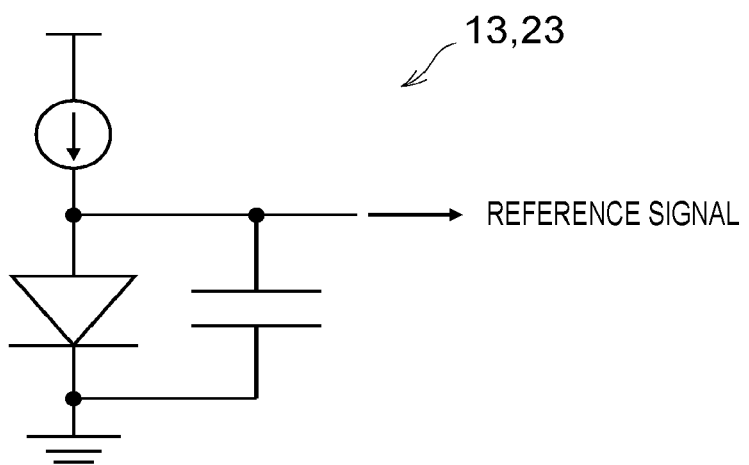
Figure 3C:
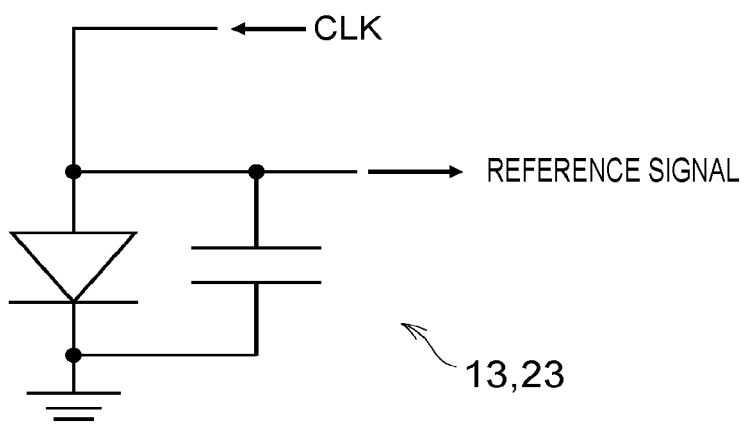
Figure 3D:
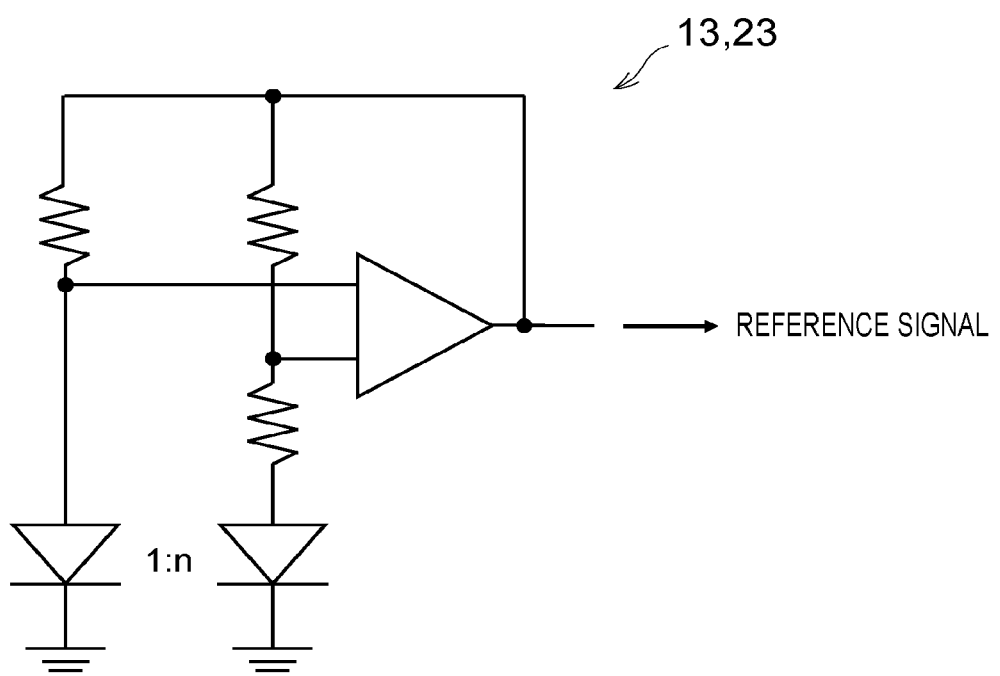

In contrast, in a case where the temperature dependency is not allowed, a band gap reference as illustrated in FIG. 3D may be used to reduce the temperature dependency of each of the first reference signal generator 12 and the second reference signal generator 23. Note that "1:n" in FIG. 3D indicates that sizes of the diodes are different from each other.

In a case where each of the first reference signal generator 12 and the second reference signal generator 23 is realized by using the configuration illustrated in FIG. 3A or 3B, it is necessary to supply power to the first reference signal generator 12 and the second reference signal generator 23.

FIG. 4 and FIG. 5 each illustrate an example in which a power supply path is added in the case where each of the first reference signal generator 12 and the second reference signal generator 23 is realized by using the configuration as illustrated in FIG. 3A or 3B. FIG. 4 is a diagram illustrating a first example of the power supply path. In FIG. 4, a power supply EV1 supplies power to the first reference signal generator 12. In addition, a power supply EV2 supplies power not only to the second reference signal generator 23 but also to the whole of the second partial circuit 2. In other words, the components of the second partial circuit 2 may be driven by the power supply EV2.

FIG. 5 is a diagram illustrating a second example of the power supply path. In FIG. 5, the first partial circuit 1 further includes a rectifier circuit 14, and the transmitter 3 further includes a fifth insulation element 35. The second reference signal generator 23 is connected to the power supply EV2 as in FIG. 4, whereas the first reference signal generator 12 is not connected to the power supply EV1. Instead, the clock signal generator 21 generates a fifth clock signal CLK5, and transmits the fifth clock signal CLK5 to the rectifier circuit 14 through the fifth insulation element 35. The rectifier circuit 14 rectifies the fifth clock signal CLK5, and transmits the rectified fifth clock signal CLK5 to the first reference signal generator 12. The first reference signal generator 12 is driven by the rectified fifth clock signal CLK5. In place of the fifth clock signal CLK5, the first clock signal CLK1 or the third clock signal CLK3 may be distributed to the rectifier circuit 14.

In the case where each of the first reference signal generator 12 and the second reference signal generator 23 is realized by using the configuration as illustrated in FIG. 3C, the clock signal is input as power to the first reference signal generator 12 and the second reference signal generator 23 as illustrated in FIG. 5. Further, in the example in FIG. 3C, the rectifier circuit 14 may be omitted. In these cases, the power in the first partial circuit 1 is supplied by the clock signal. This eliminates necessity of arranging the power supply in the first partial circuit 1, which contributes to reduction in the number of components, in size, and in cost of the electronic circuit 4.

(Third Internal Configuration Example)

Figure 6A:
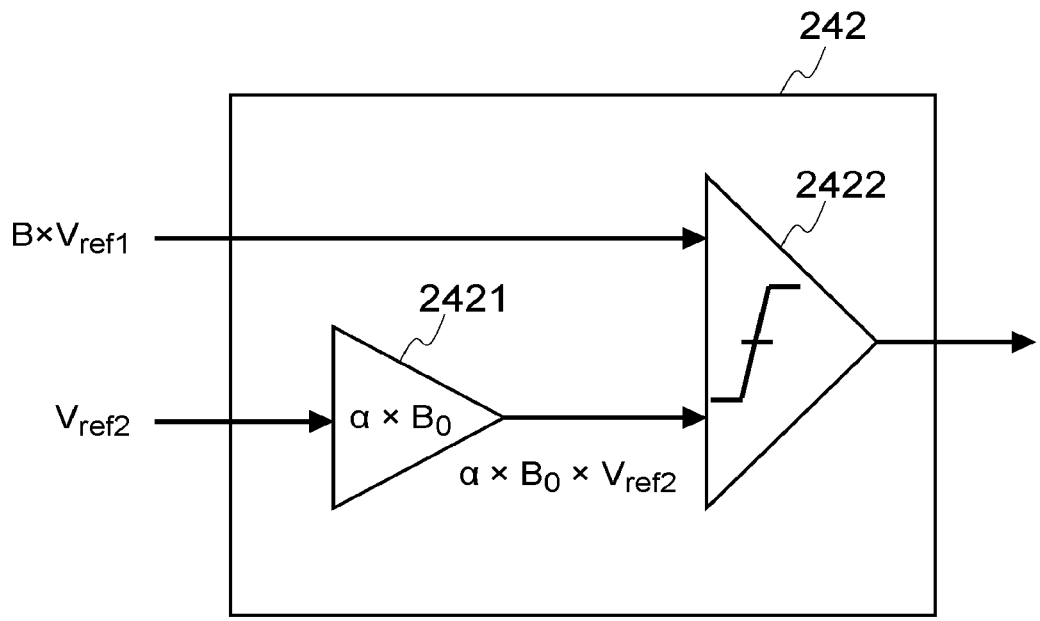
FIGS. 6A to 6C are diagrams each illustrating an example of an internal configuration of a comparison device.
Figure 6B:
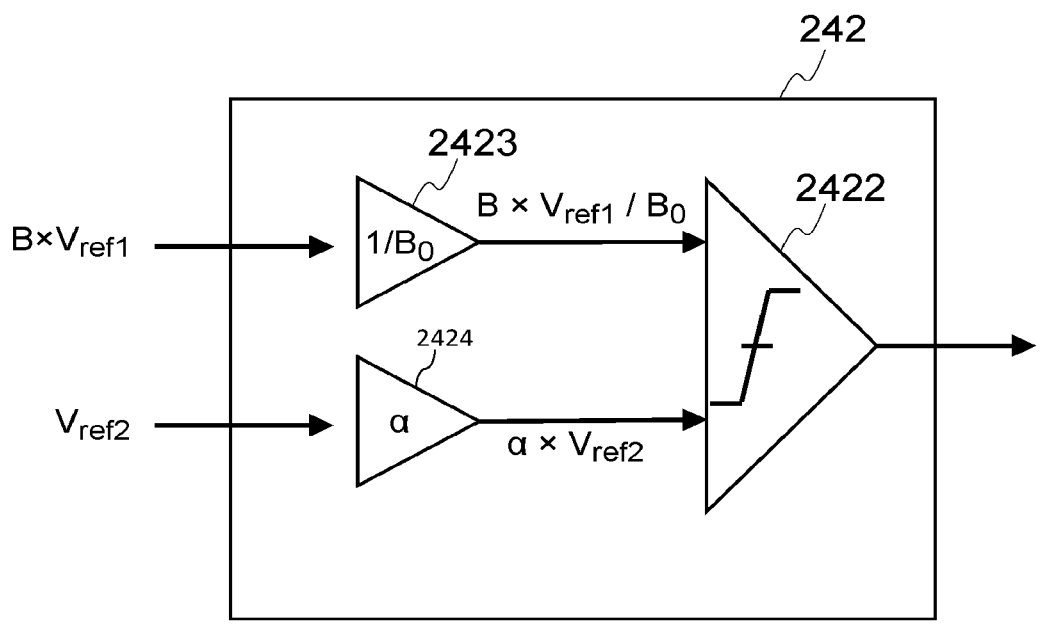
Figure 6C:
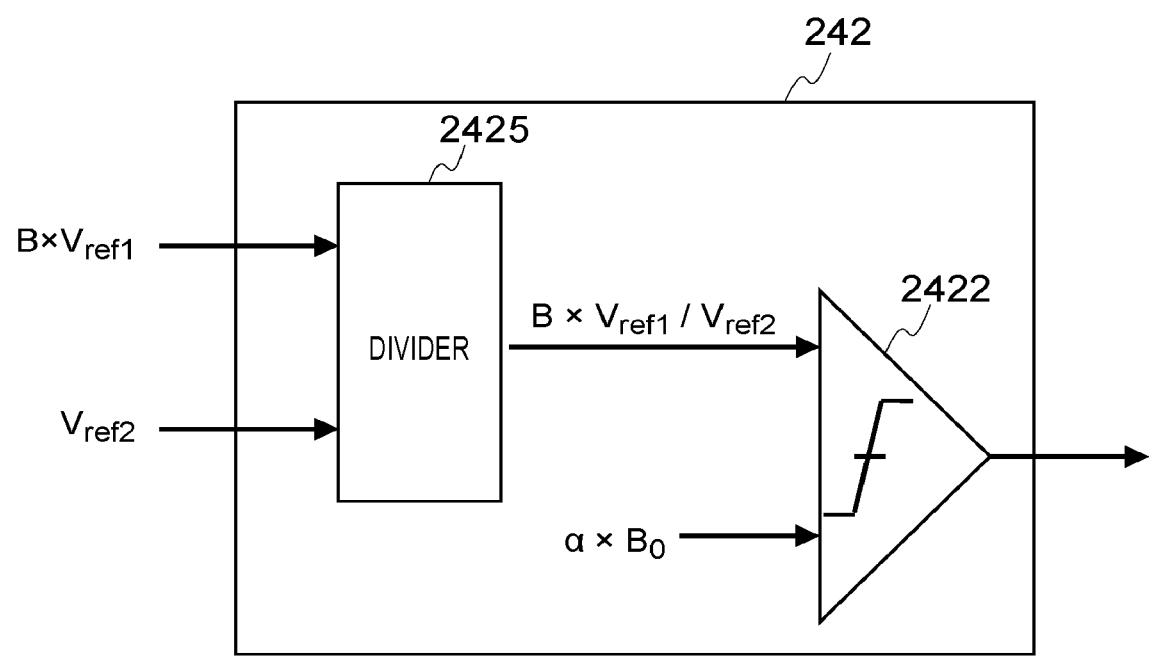

The comparison device 242 also can have various internal configurations. Possible internal configurations are illustrated. FIGS. 6A to 6C are diagrams each illustrating an example of the internal configuration of the comparison device 242. In an example of FIG. 6A, the comparison device 242 includes a third variable gain device 2421 and a comparator 2422. The third variable gain device 2421 receives the second reference signal having the gain "$V_{ref2}$" from the second reference signal generator 23, multiplies the gain by a predetermined value "$\alpha \times B_0$", and outputs the second reference signal, the gain of which has been adjusted to "$\alpha \times B_0 \times V_{ref2}$". The comparator 2422 receives the first reference signal, the gain of which has been adjusted to "$B \times V_{ref1}$" by the first variable gain device 241, and compares the first reference signal with the second reference signal having the gain "$\alpha \times B_0 \times V_{ref2}$". As described above, since the value "a" is equal to "$V_{ref1}/V_{ref2}$", it is determined whether the gain "B" is greater than the target value "B0". Further, as described above, the signal based on the determination is input to the gain adjuster 243, and the gain adjuster 243 adjusts the gain "B" to be close to the target value "B0".

In the example of FIG. 6B, the comparison device 242 includes a fourth variable gain device 2423, a fifth variable gain device 2424, and the comparator 2422. In FIG. 6A, the gain "$\alpha \times B_0$" is multiplied to the second reference signal, whereas in FIG. 6B, the fourth variable gain device 2423 multiplies the first reference signal having the gain "$B \times V_{ref1}$" by a gain "$1/B_0$", and the fifth variable gain device 2424 multiplies the second reference signal only by the gain "$\alpha$". Even in this case, the result of the comparator 2422 becomes equal to the result in the example of FIG. 6A.

In an example of FIG. 6C, the comparison device 242 includes a divider 2425 and the comparator 2422. In FIG. 6C, the divider 2425 receives the first reference signal having the gain "$B \times V_{ref1}$" and the second reference signal having the gain "$V_{ref2}$", and outputs a signal having a gain "$B \times V_{ref1}/V_{ref2}$". The comparator 2422 compares the signal having the gain "$B \times V_{ref1}/V_{ref2}$" and a predetermined value "$\alpha \times B_0$". Even in this case, the result of the comparator 2422 becomes equal to the result in the example of FIG. 6A.

As described above, the configuration of the comparison device 242 is not limited as long as the comparison device 242 can determine whether the gain "B" is greater than the target value "B0". For example, other than the above-described examples, the gain may be multiplied only to the output of the second variable gain device 251, or the third variable gain device 2421 may be omitted by performing design such that the gain "$\alpha \times B0$" becomes 1. Alternatively, the comparator 2422 may be replaced with an AD converter, and a multiple-bit determination result may be output in place of a 1-bit determination result of YES or NO. For example, the multiple-bit determination result is output, which makes it possible to calculate a difference between the gain "B" and the target value "B0". In a case where the difference is less than or equal to a predetermined allowable error, the change of the signal for gain adjustment that is transmitted from the gain adjuster 243 to each of the first variable gain device 241 and the second variable gain device 251 may be terminated.

(Fourth Internal Configuration Example)

In the above-described examples, the signal channel is a single-phase signal channel; however, the signal channel may be a differential signal channel. FIG. 7 is a diagram illustrating a configuration example in a case of the differential signal channel. The channels for the input signal, the clock signals, and the reference signals are made double in order to cause signals of reverse phases to pass therethrough. The input terminal and the output terminal are made double. Note that using a configuration obtained by changing the same configuration to the single-phase configuration can easily configure a single-phase circuit.

Figure 8:
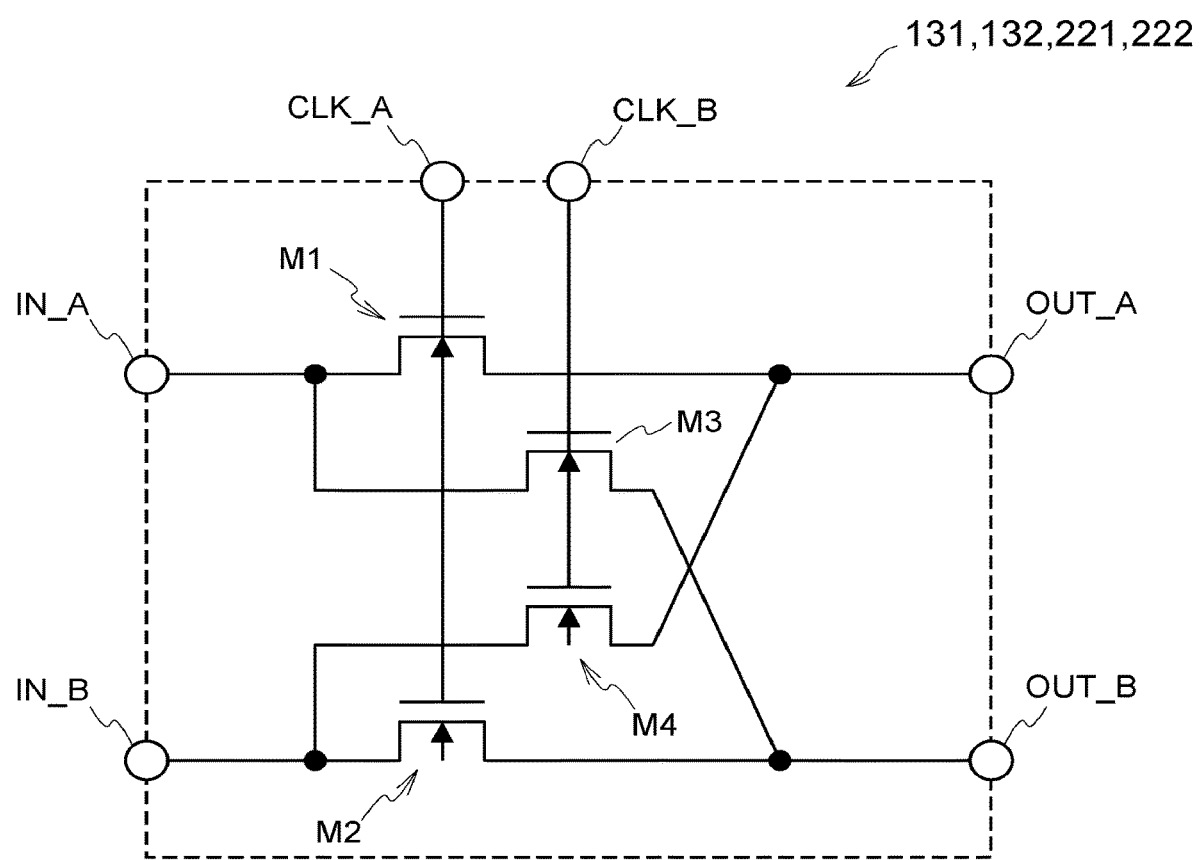
FIG. 8 is a diagram illustrating a configuration example of each of mixers in the case of the differential signal channel.

FIG. 8 is a diagram illustrating a configuration example of each of the mixers in the case of the differential signal channel. Each of the mixers includes four NMOS transistors M1, M2, M3, and M4. In the following, the four NMOS transistors M1, M2, M3, and M4 are simply referred to as the transistors M1, M2, M3, and M4. Each of the mixers receives the input signals at terminals IN_A and IN_B. Each of the mixers is driven based on clock signals CLK_A and CLK_B to perform frequency conversion of the input signals, and outputs the frequency-converted signals from terminals OUT_A and OUT_B. The mixer illustrated in FIG. 8 is a passive mixer including the NMOS transistors, and operates only by the input of the clock signals even without receiving supply of power. In the case where the mixer having such a configuration is used, it is sufficient to supply power to operate only the first reference signal generator 12, to the first partial circuit 1.

Operation of each of the mixers in the case of the differential signal channel is described. In a case where the clock signal CLK_A is high and the clock signal CLK_B is low, the transistors M1 and M2 are turned on and the transistors M3 and M4 are turned off. In this case, the signal received at the terminal IN_A is transmitted to the terminal OUT_A, and the signal received at the terminal IN_B is transmitted to the terminal OUT_B. In contrast, in a case where the clock signal CLK_A is low and the clock signal CLK_B is high, the transistors M3 and M4 are turned on and the transistors M1 and M2 are turned off. In this case, the signal received at the terminal IN_A is transmitted to the terminal OUT_B, and the signal received at the terminal IN_B is transmitted to the terminal OUT_A. When high and low of the clock signals CLK_A and CLK_B are switched, the first mixer 131 and the third mixer 132 each convert the input signal into a high-frequency signal. Further, in a case where the high-frequency signal is input to each of the second mixer 221 and the fourth mixer 222, when high and low of the clock signals CLK_A and CLK_B are switched by the same operation, the signal converted into the high-frequency signal is restored and converted into the original analog signal.

(Fifth Internal Configuration Example)

Figure 9:
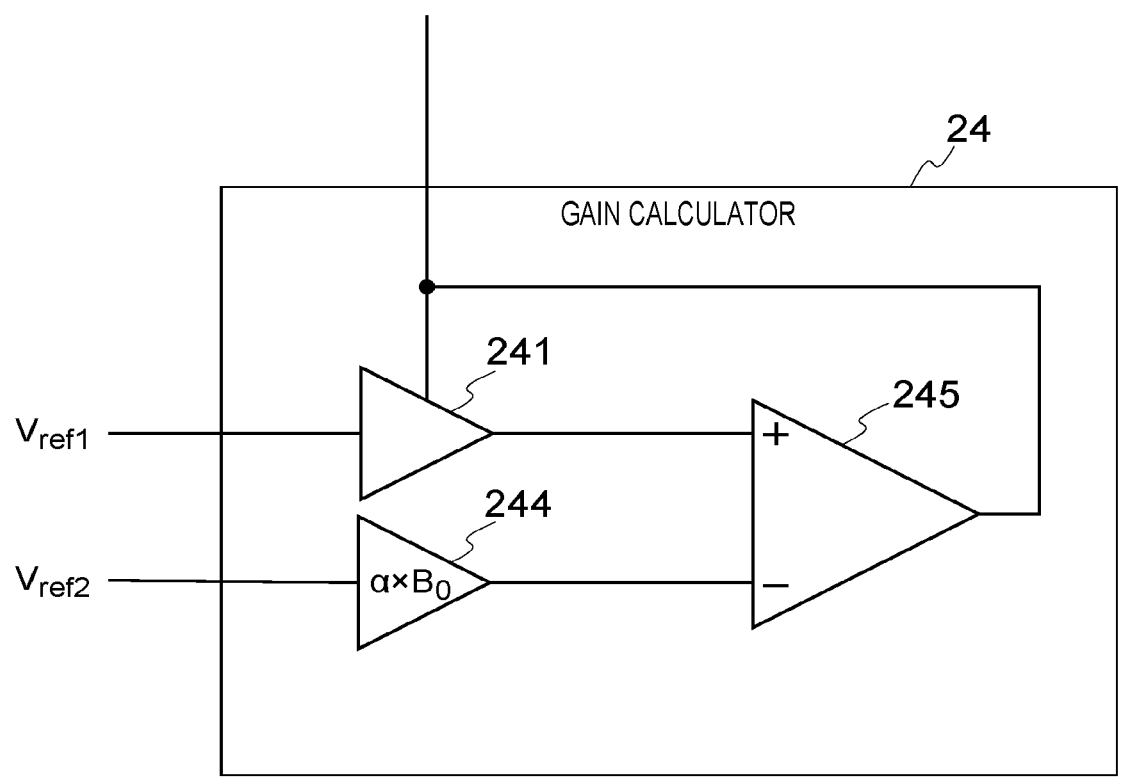
FIG. 9 is a diagram illustrating another example of a configuration of a gain calculator.

In the above-described internal configuration examples, the example in which the gain calculator 24 includes the comparison device 242 including the comparator 2422, and the gain adjuster 243 has been illustrated. Alternatively, the comparator 2422 may be replaced with an analog subtraction circuit and the gain adjuster 243 is replaced with an analog amplifier to configure a negative feedback circuit, and the difference between the gain "B" and the target value "B0" may be brought close to zero. FIG. 9 is a diagram illustrating another example of the configuration of the gain calculator 24. In the example of FIG. 9, the gain calculator 24 includes a sixth variable gain device 244 and a differential amplifier 245 in place of the comparison device 242 and the gain adjuster 243. In the example of FIG. 9, adjustment using the negative feedback of the analog signal is performed. A part of the comparison device 242 and a function of a gain adjustment signal generator are realized by one differential amplifier 245, and the gain is adjusted by the negative feedback such that the two input signals of the differential amplifier 245 are coincident with each other.

(Sixth Internal Configuration Example)

Figure 10:
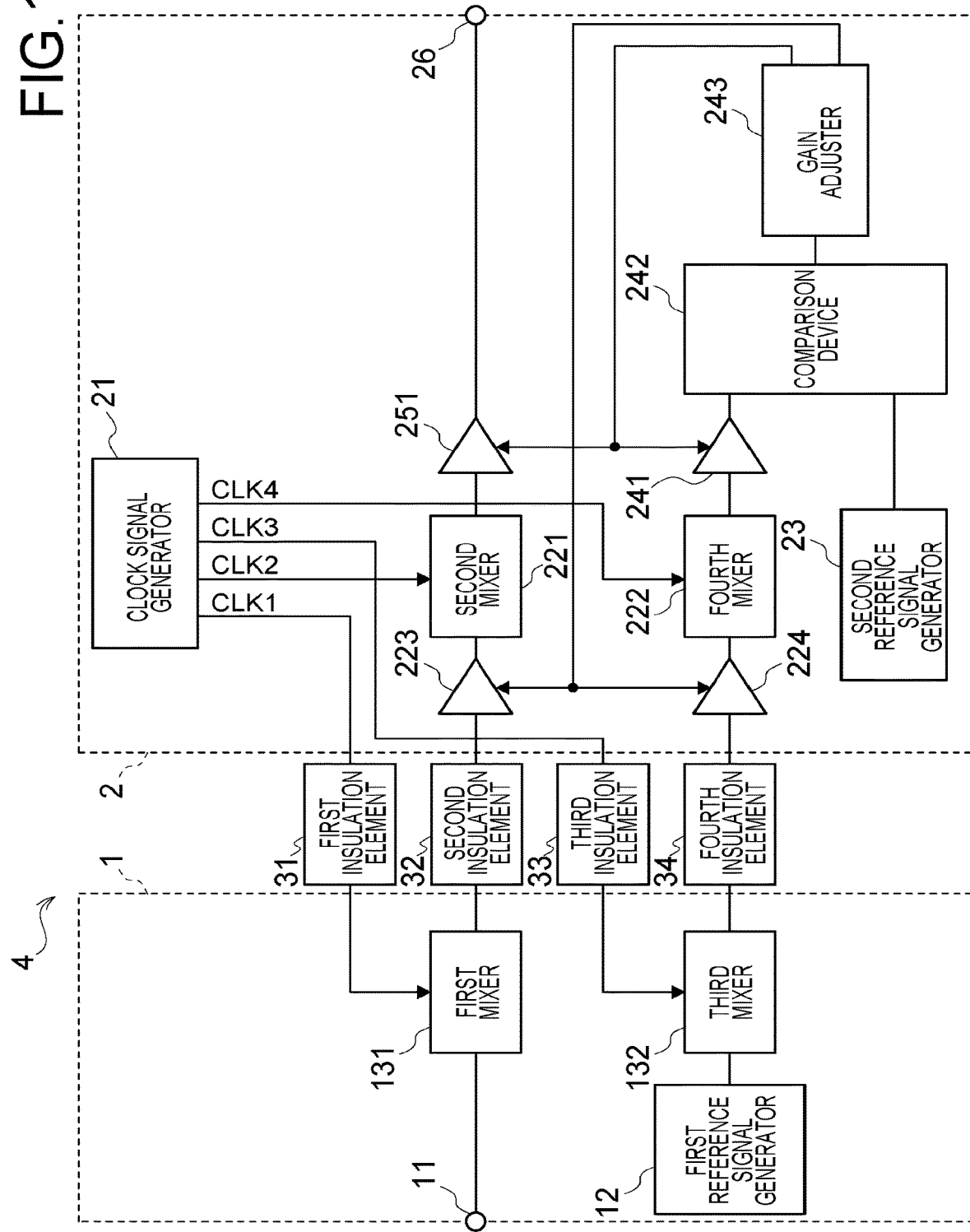
FIG. 10 is a diagram illustrating a configuration example in which a second frequency converter further includes seventh and eighth variable gain devices.

FIG. 10 is a diagram illustrating a configuration example in which the second frequency converter 22 further includes a seventh variable gain device 223 and an eighth variable gain device 224. The seventh variable gain device 223 receives the input signal converted into the high-frequency signal by the first mixer 131, before the second mixer 221, and transmits the high-frequency signal to the second mixer 221 after adjusting the gain of the high-frequency signal. The eighth variable gain device 224 receives the input signal converted into the high-frequency signal by the third mixer 132, before the fourth mixer 222, and transmits the high-frequency signal to the fourth mixer 222 after adjusting the gain of the high-frequency signal. The ratio of the gain of the seventh variable gain device 223 and the gain of the eighth variable gain device 224 is made equal to the ratio of the gain of the first variable gain device 241 and the gain of the second variable gain device 251. As described above, the gains may be adjusted before the processing by the second mixer 221 and the fourth mixer 222. Further, in a case where the gains are adjusted before the processing by the second mixer 221 and the fourth mixer 222 and the gain adjustment is unnecessary after the processing by the second mixer 221 and the fourth mixer 222, the first variable gain device 241 and the second variable gain device 251 may be omitted.

(Seventh Internal Configuration Example)

Figure 11:
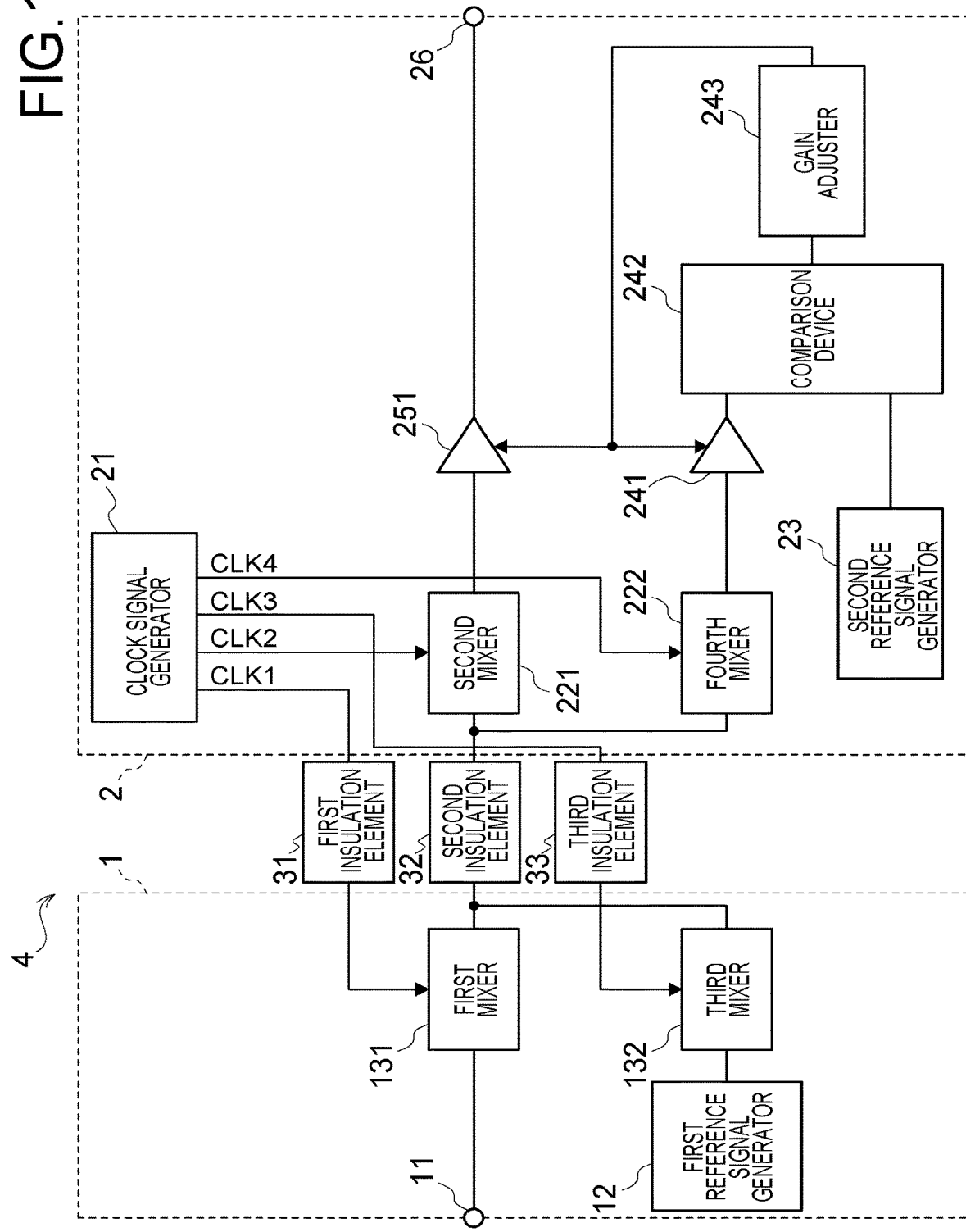
FIG. 11 is a diagram illustrating a configuration example in which the number of insulation elements included in a transmitter is reduced.

FIG. 11 is a diagram illustrating a configuration example in which the number of insulation elements included in the transmitter 3 is reduced. In FIG. 11, the transmitter 3 does not include the fourth insulation element 34. Therefore, the first reference signal converted into the high-frequency signal from the third mixer 132 is transmitted to the fourth mixer 222 through the second insulation element 32. For example, unlike the above-described configurations, the clock signal generator 21 does not simultaneously output the clock signals CLK1 to CLK4 but outputs the clock signals in a time-division manner. More specifically, when the clock signal generator 21 outputs a set of the clock signals CLK1 and CLK2, the clock signal generator 21 does not output a set of the clock signals CLK3 and CLK4. When the clock signal generator 21 outputs the set of the clock signals CLK3 and CLK4, the clock signal generator 21 does not output the set of the clock signals CLK1 and CLK2. This causes only one of the input signal converted into the high-frequency signal and the first reference signal converted into the high-frequency signal to be input to the third insulation element 33. In this case, when the fourth mixer 222 does not operate, the gain calculator 24 also continuously outputs the gain calculated when the fourth mixer 222 operates. This enables the gain adjustment device 25 to adjust the gain of the input signal restored by the second mixer 221. The number of insulation elements may be reduced in the above-described manner.

(Eighth Internal Configuration Example)

Figure 12:
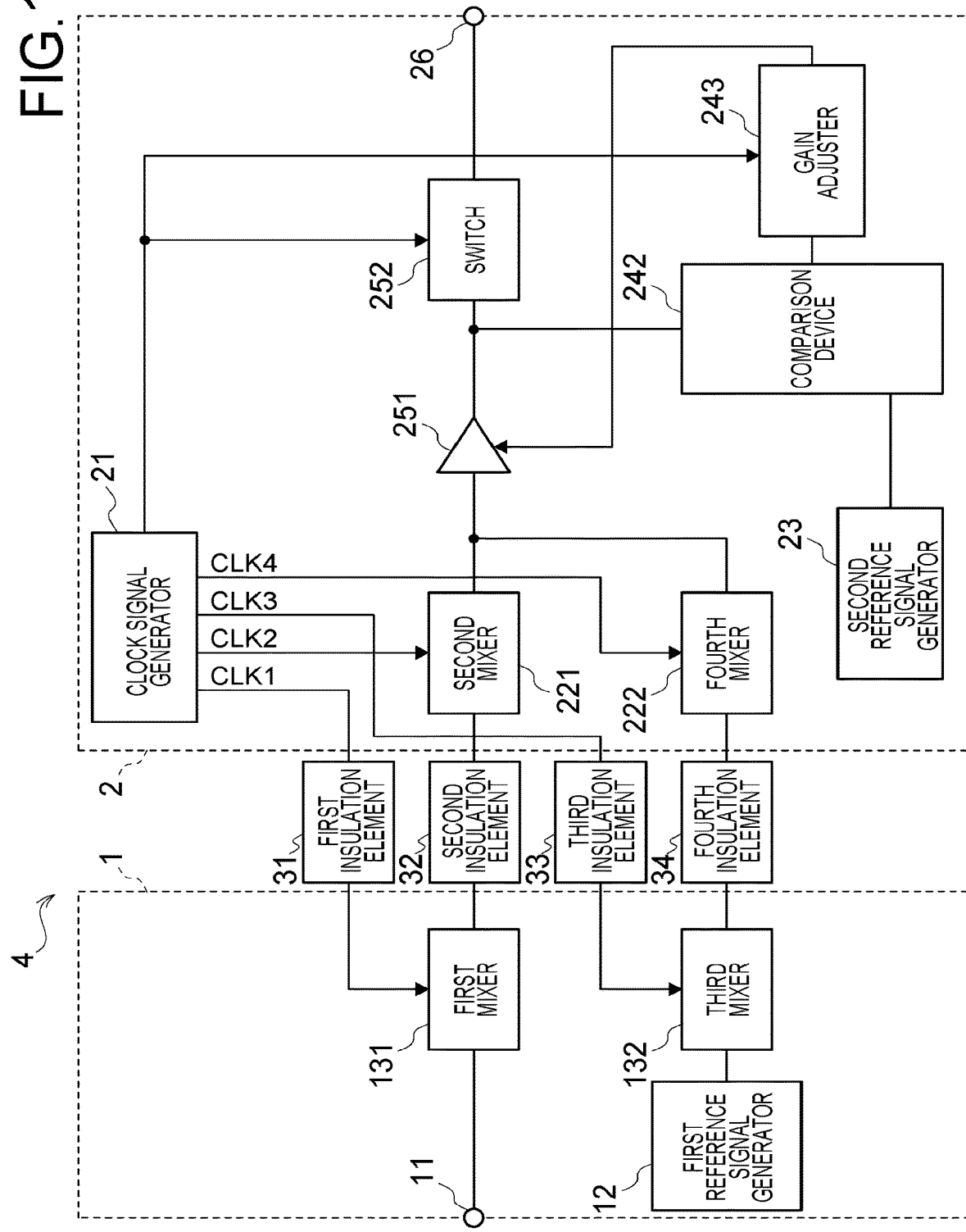
FIG. 12 is a diagram illustrating a configuration example in which the number of variable gain devices in a second partial circuit is reduced.

FIG. 12 is a diagram illustrating a configuration example in which the number of variable gain devices of the second partial circuit 2 is reduced. FIG. 12 illustrates an example in which the gain adjustment device 25 further includes a switch 252, and the gain calculator 24 does not include the first variable gain device 241.

In the present configuration example, the first reference signal restored by the fourth mixer 222 is not input to the gain calculator 24 but is input to the second variable gain device 251. Further, when the clock signal generator 21 outputs the set of the clock signals CLK1 and CLK2, the clock signal generator 21 does not output the set of the clock signals CLK3 and CLK4. When the clock signal generator 21 outputs the set of the clock signals CLK3 and CLK4, the clock signal generator 21 does not output the set of the clock signals CLK1 and CLK2.

Further, in the present configuration example, the clock signal generator 21 newly supplies a signal indicating timing when the gain adjustment is performed, to the gain adjuster 243 and the switch 252. The signal is referred to as a timing signal. The timing signal is interlocked with output of the clock signals. For example, when the set of the clock signals CLK1 and CLK2 is output, the timing signal is turned on. When the set of the clock signals CLK3 and CLK4 is output, the timing signal is turned off. Further, when the timing signal is turned on, namely, when the set of the clock signals CLK1 and CLK2 is output, the gain adjuster 243 continuously maintains the output without changing the output, and the switch 252 is turned on to connect the first variable gain device 241 and the output terminal 26. When the timing signal is turned off, namely, when the set of the clock signals CLK3 and CLK4 is output, the gain adjuster 243 adjusts the gain, but the switch 252 is turned off to disconnect the first variable gain device 241 and the output terminal 26. Therefore, the signal under gain adjustment is not output from the output terminal 26. This makes it possible to adjust the gain without using the second variable gain device 251. Therefore, downsizing of the circuit, reduction of power consumption, etc. can be expected. Further, since the variable gain device in the channel same as the input signal can be used for the gain adjustment, improvement in adjustment accuracy can be expected.

(Ninth Internal Configuration Example)

In the eighth internal configuration example, when the clock signal generator 21 outputs the set of the clock signals CLK1 and CLK2, the clock signal generator 21 does not output the set of the clock signals CLK3 and CLK4. When the clock signal generator 21 outputs the set of the clock signals CLK3 and CLK4, the clock signal generator 21 does not output the set of the clock signals CLK1 and CLK2. Therefore, the second mixer 221 and the fourth mixer 222 are alternately driven. This makes it possible to cause the second mixer 221 to serve also as the fourth mixer 222, which allows for reduction in the number of mixers.

Figure 13:
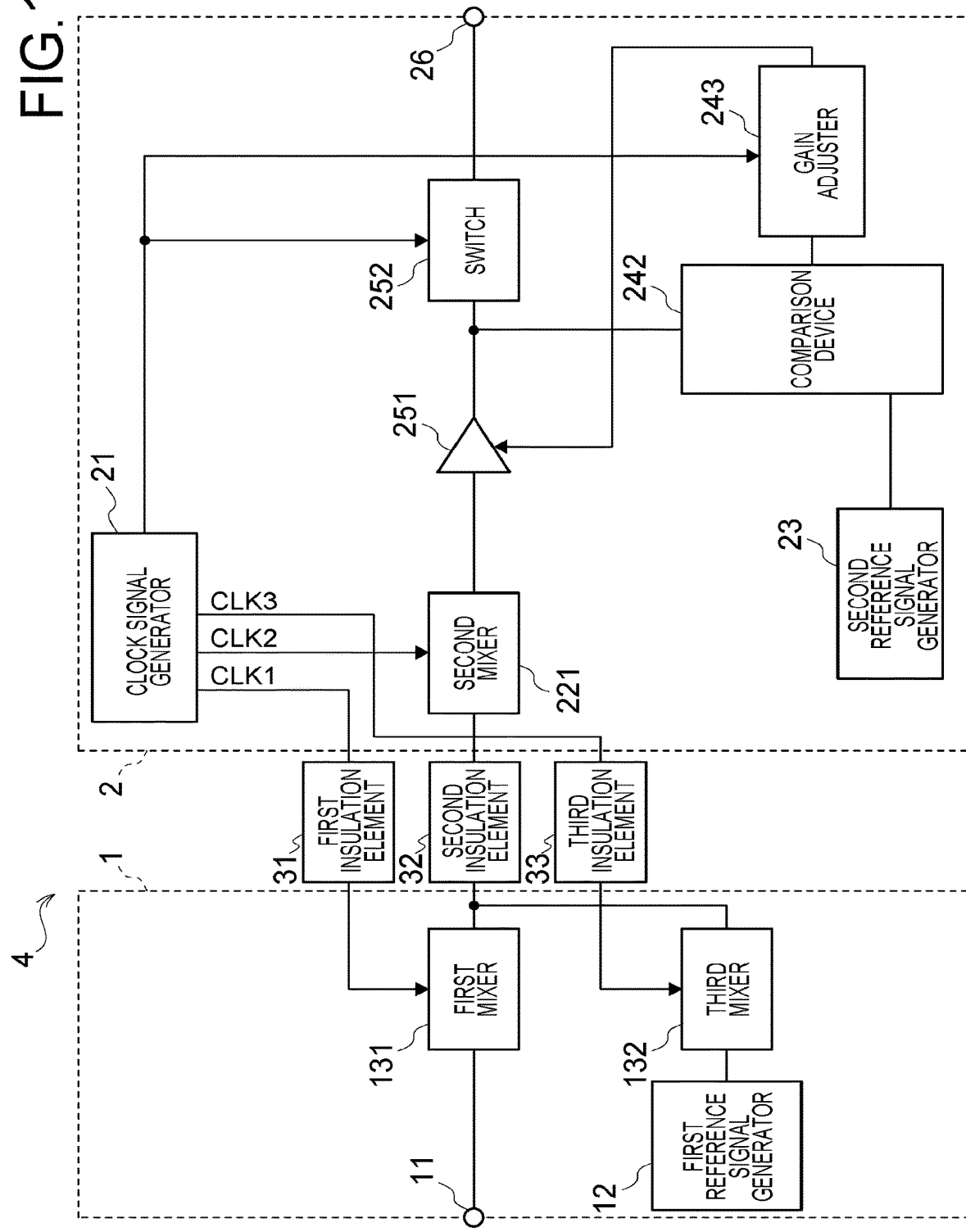
FIG. 13 is a diagram illustrating a configuration example in which the number of mixers in the second partial circuit is reduced.

FIG. 13 is a diagram illustrating a configuration example in which the number of mixers of the second partial circuit 2 is reduced. FIG. 13 illustrates an example in which the second frequency converter 22 does not include the fourth mixer 222. Since the fourth mixer 222 is not provided, the channel from the third mixer 132 to the fourth mixer 222 is unnecessary. Therefore, in the example of FIG. 13, the fourth insulation element 34 is also omitted. Note that the fourth insulation element 34 may be left. Further, the clock signal generator 21 alternately outputs the set of the clock signals CLK1 and CLK2 and the set of the clock signals CLK2 and CLK3.

In the example of FIG. 13, the third mixer 132 is connected to the second insulation element 32. Accordingly, when the clock signals CLK2 and CLK3 are output, the frequency-converted first reference signal is transmitted by the second insulation element 32. When the clock signals CLK1 and CLK2 are output, the frequency-converted input signal is transmitted by the second insulation element 32.

When the clock signals CLK2 and CLK3 are output, the second mixer 221 outputs the restored first reference signal. When the clock signals CLK1 and CLK2 are output, the second mixer 221 outputs the restored input signal. Therefore, the input of the second variable gain device 251 becomes the same as in the eighth internal configuration example. Accordingly, when the clock signal generator 21 outputs the timing signal as in the eighth internal configuration example, the output signal same as in the eighth internal configuration example is obtainable.

Figure 14:
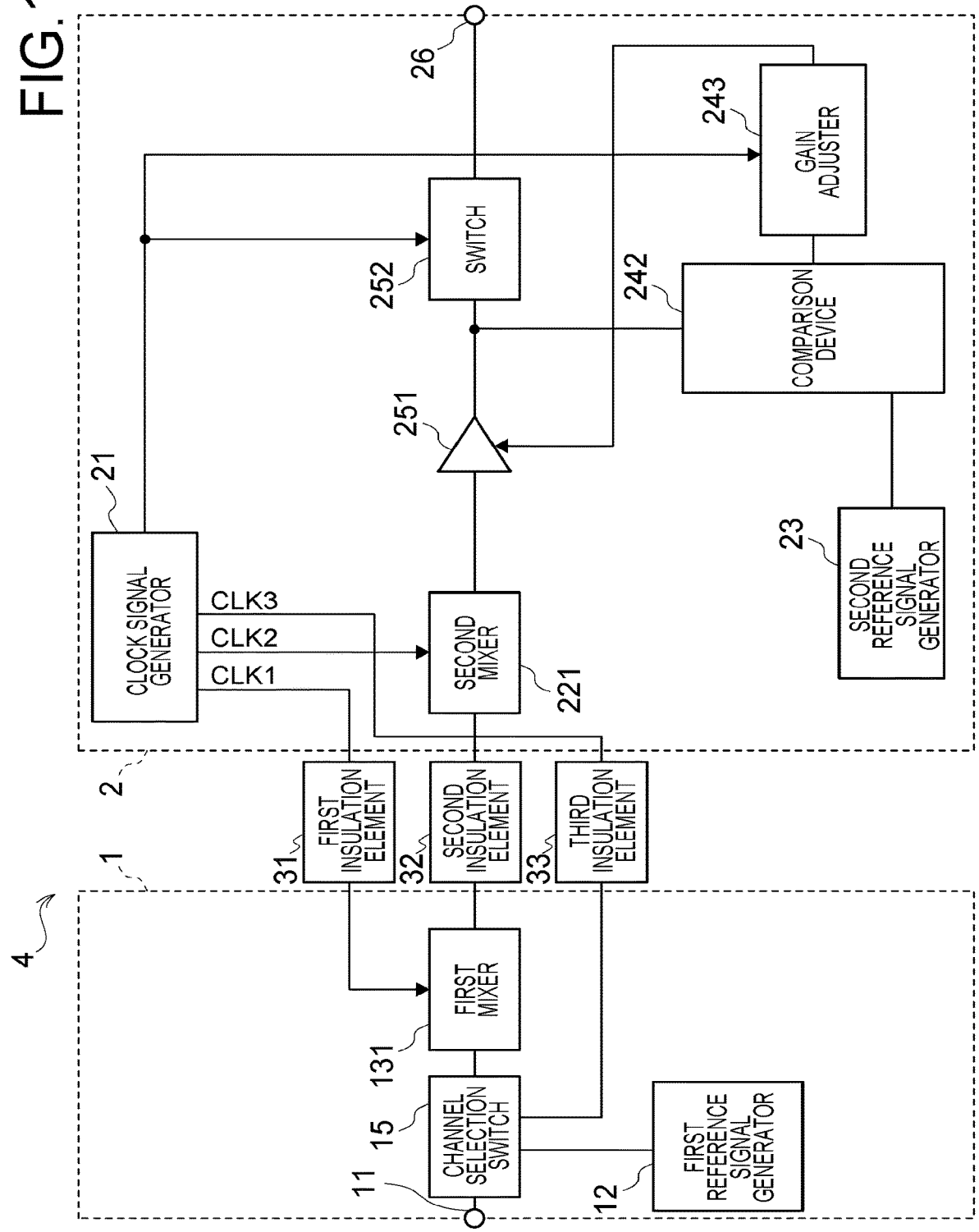
FIG. 14 is a diagram illustrating a configuration example in which the number of mixers in a first partial circuit is reduced.

Further, the first mixer 131 may serve also as the third mixer 132 to reduce the number of mixers. FIG. 14 is a diagram illustrating a configuration example in which the number of mixers of the first partial circuit 1 is reduced. In the example of FIG. 14, the third mixer 132 is further removed from the example of FIG. 13, and a channel selection switch 15 is added.

In the above-described examples, the input signal from the input terminal 11 is input to the first mixer 131, whereas in the example of FIG. 14, the input signal and the first reference signal are alternately input to the first mixer 131. In other words, there are a time when the input terminal 11 and the first mixer 131 are connected and a time when the first reference signal generator 12 and the first mixer 131 are connected. These connections are switched by the channel selection switch 15. Further, the clock signal generator 21 transmits, in place of the clock signal CLK3, a signal switching these connections to the channel selection switch 15 through the third insulation element 33.

As described above, the first mixer 131 is shared and the third mixer 132 may be removed by using the channel selection switch to selectively switch the channel of the signal input to the first mixer 131 to one of the input terminal 11 and the first reference signal generator 12.

(Ninth Internal Configuration Example)

In the case where each of the mixers of the first partial circuit 1 is configured by a passive mixer as in the fourth internal configuration example, only the first reference signal generator 12 mainly consumes the power in the first partial circuit 1. Reducing the power necessary for operation of the first reference signal generator 12 allows for simplification of the circuit for power supply. Therefore, the power consumption by the first reference signal generator 12 is desirably small.

Figure 15:
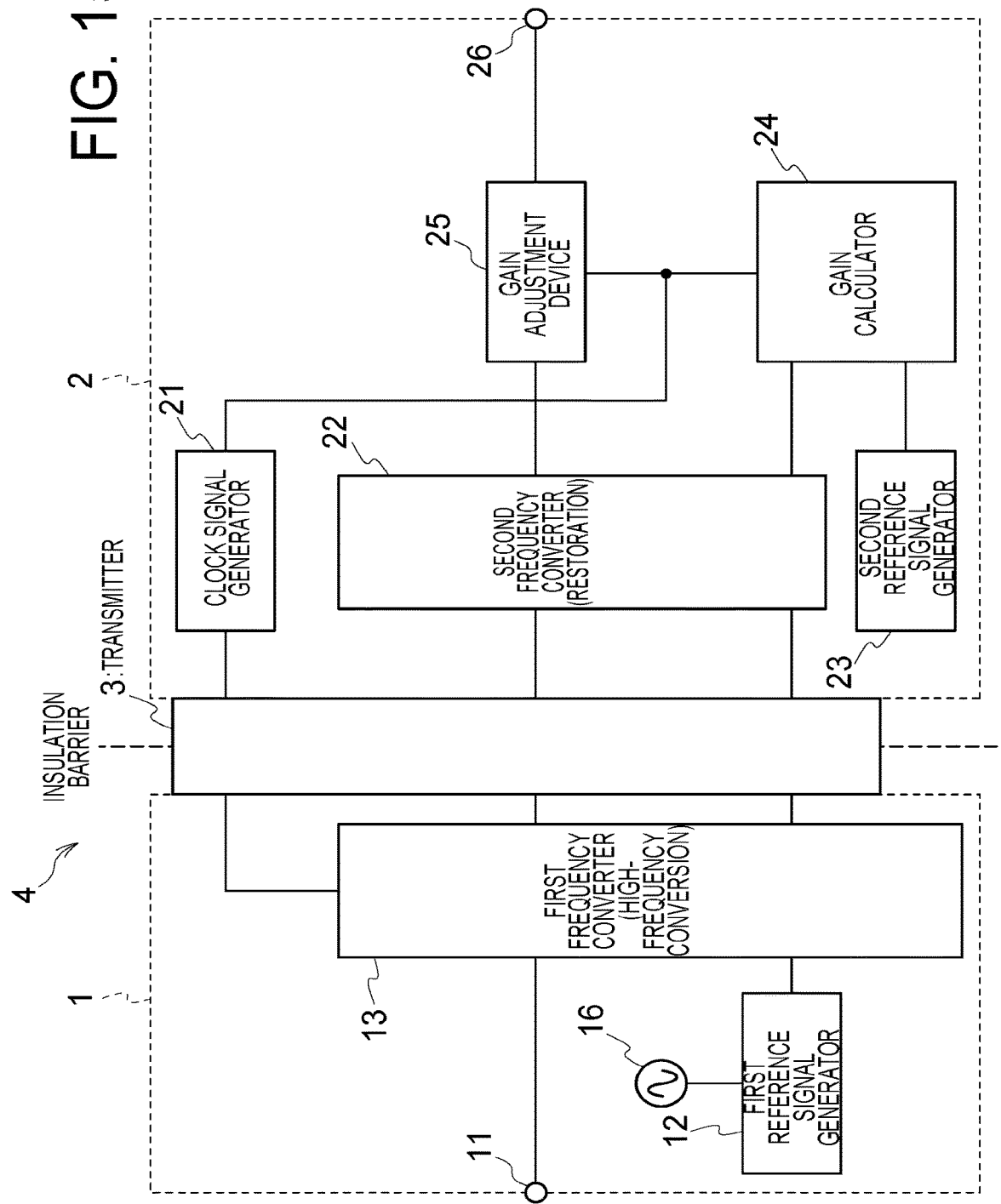
FIG. 15 is a diagram illustrating an example in which power consumption by the first reference signal generator is suppressed.

FIG. 15 is a diagram illustrating an example in which the power consumption by the first reference signal generator 12 is suppressed. In FIG. 15, the first partial circuit 1 further includes an oscillator 16, and an output signal of the oscillator 16 is input to the first reference signal generator 12. The output signal is used as an intermittent operation control signal to cause a part of the circuit of the first reference signal generator 12 to perform intermittent operation. This makes it possible to reduce the power consumption. For example, causing the above-described differential amplifier 245 to perform intermittent operation makes it possible to reduce the power consumption.

Note that the intermittent operation control signal may not be generated by the oscillator 16. For example, in the example of FIG. 5, the fifth clock signal CLK5 is used as driving power of the first reference signal generator 12; however, the fifth clock signal CLK5 may be used as the intermittent operation control signal. Alternatively, any of the clock signals CLK1 to CLK4 may be input as the intermittent operation control signal to the first reference signal generator 12.

Further, to reduce the power consumption by the second partial circuit 2 and to reduce a difference of the output reference voltages output from the first reference signal generator 12 and the second reference signal generator 23 having the same configuration, the second reference signal generator 23 may perform intermittent operation as with the first reference signal generator 12.

(Tenth Internal Configuration Example)

The first reference signal generator 12 may have a configuration different from the generally-known band gap reference as with the example of FIG. 3D. For example, the same current is caused to flow through diodes or bipolar transistors different in size, and the temperature characteristics are corrected by using the fact that the voltage and the difference voltage generated between terminals of each of the diodes or each of the bipolar transistors have the temperature characteristics reversed in positive and negative. This makes it possible to generate the reference voltage having small temperature dependency.

Figure 16:
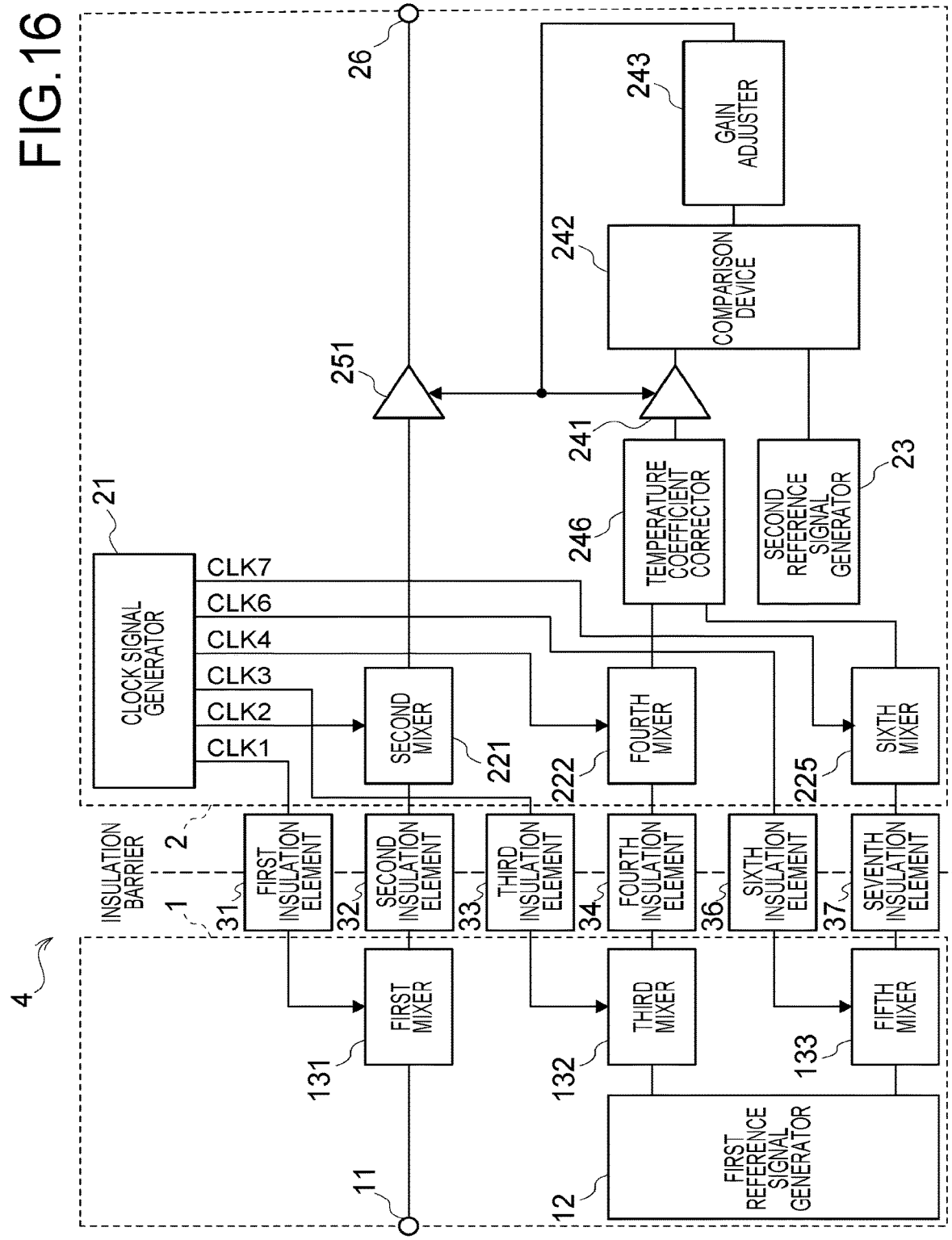
FIG. 16 is a diagram illustrating a configuration example in a case where the first reference signal generator includes diodes or bipolar transistors different in size.

FIG. 16 is a diagram illustrating a configuration example in a case where the first reference signal generator 12 includes diodes or bipolar transistors different in size. In this example, the first frequency converter 13 further includes a fifth mixer 133, the transmitter 3 further includes a sixth insulation element 36 and a seventh insulation element, the second frequency converter 22 further includes a sixth mixer 225, and the gain calculator 24 further includes a temperature coefficient corrector 246. Further, the first reference signal generator 12 generates signals based on the two voltages. These signals are referred to as a first reference signal A and a first reference signal B. The clock signal generator 21 further generates a sixth clock signal CLK6 and a seventh clock signal CLK7. The third clock signal CLK3 may serve also as the sixth clock signal CLK6, and the fourth clock signal CLK4 may serve also as the seventh clock signal CLK7.

The first reference signal A is transmitted to the fourth mixer 222 in the manner same as the first reference signal described above. The first reference signal B is converted into a high-frequency signal by the fifth mixer 133, and the high-frequency signal is transmitted to the sixth mixer 225 by the seventh insulation element and is restored to the analog signal by the sixth mixer 225. The fifth mixer 133 is controlled by the sixth clock signal CLK6, and the sixth mixer 225 is controlled by the seventh clock signal CLK7. The fifth clock signal CLK5 is transmitted from the clock signal generator 21 to the fifth mixer 133 through the sixth insulation element 36.

The temperature coefficient corrector 246 receives the first reference signal A restored to the analog signal, and the first reference signal B restored to the analog signal, and corrects the temperature characteristics to generate a signal having small temperature dependency. The generated signal is used in place of the restored first reference signal in the above-described examples.

The second partial circuit 2 calculates the temperature coefficient correction in the above-described manner, which makes it possible to reduce the power of the first partial circuit 1. Note that, as described below, the first reference signal generator 12 is configured such that the voltage of the first reference signal A and the voltage of the first reference signal B have relationship correcting the temperature coefficient.

Figure 17:
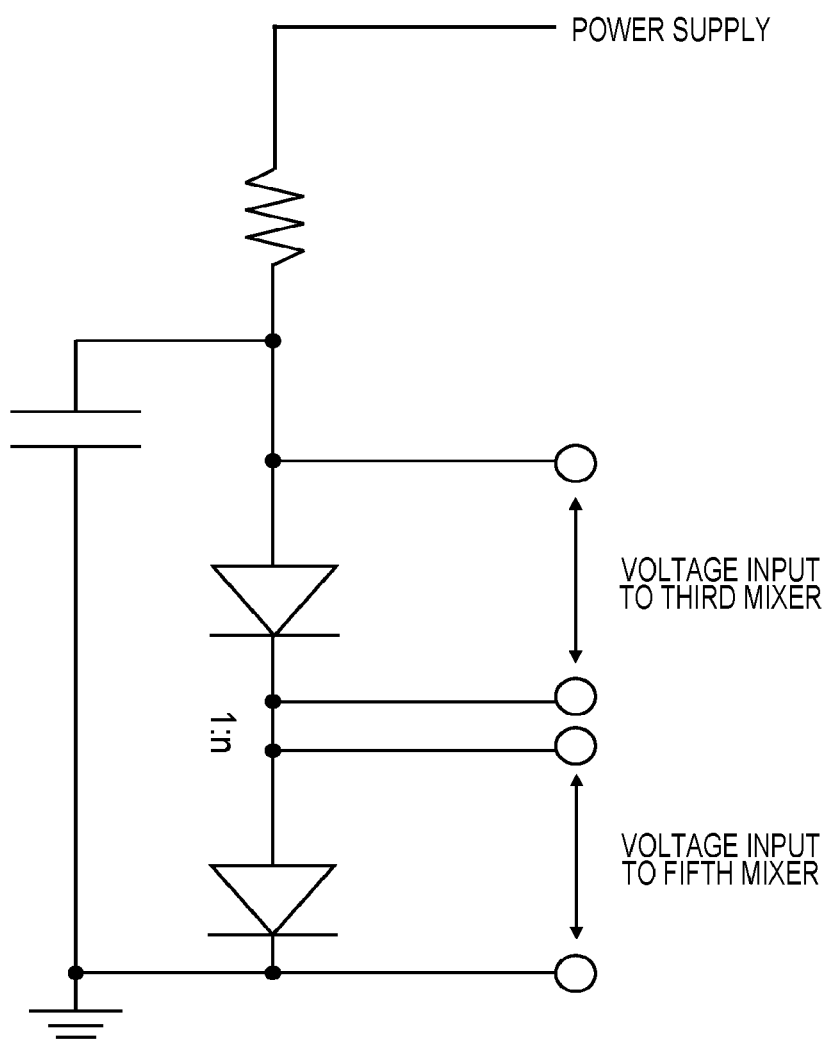
FIG. 17 is a diagram illustrating a configuration example of the first reference signal generator including the diodes different in size.

FIG. 17 is a diagram illustrating a configuration example of the first reference signal generator 12 including diodes different in size. As illustrated in FIG. 17, the first reference signal generator 12 includes a first element that is a diode or a bipolar transistor, and a second element that is a diode or a bipolar transistor. The first element and the second element are connected in series. The same current flows through each of the two diodes illustrated in FIG. 17. Therefore, the voltages same as the voltages generated in the two diodes in the band gap reference illustrated in FIG. 3D can be taken out as outputs to the third mixer 132 and the fifth mixer 133. In other words, the first reference signal A input to the third mixer 132 is generated based on the voltage between both ends of the first element, and the first reference signal B input to the fifth mixer 133 is generated based on the voltage between both ends of the second element. Power supply to the first reference signal generator 12 may be performed in the manner same as in the first internal configuration example.

Figure 18:
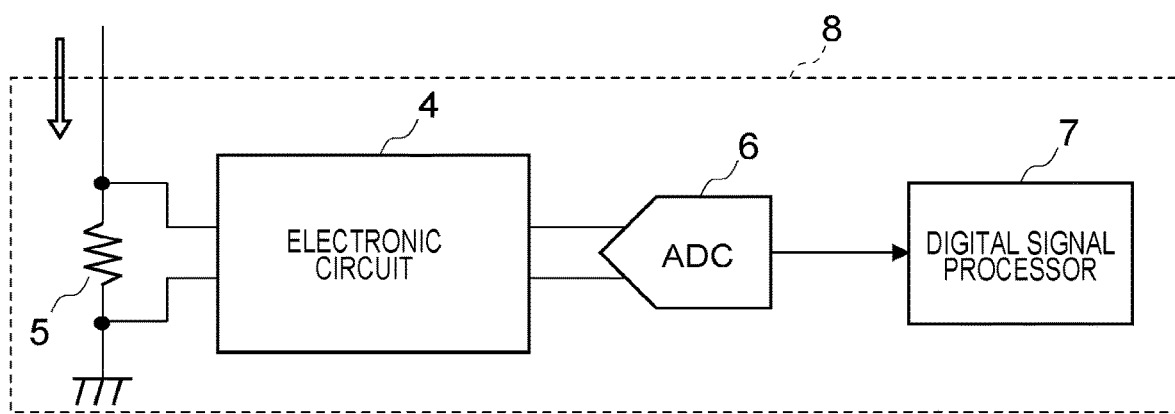
FIG. 18 is a diagram illustrating an example of an electronic apparatus using the electronic circuit.

Such an electronic circuit 4 can be used in various applications, and can be incorporated in various electronic apparatuses (or devices). FIG. 18 is a diagram illustrating an example of an electronic apparatus using the electronic circuit 4. In the example of FIG. 18, an electronic apparatus 8 includes a resistor 5, the electronic circuit 4, an analog-to-digital converter (ADC) 6, and a digital signal processor 7. The electronic circuit 4 acquires a current flowing through the resistor 5 as an input signal, the analog-to-digital converter 6 converts an output signal from the electronic circuit 4 into a digital signal, and the digital signal processor 7 processes the digital signal. The digital signal may be processed in any manner. For example, to present a magnitude of the current flowing through the resistor 5, the digital signal may be displayed on a monitor. In this case, the electronic apparatus 8 is also referred to as a current measurement device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An electronic circuit, comprising:
a first circuit;
a second circuit electrically insulated from the first circuit; and
a transmitter configured to transmit signals between the first circuit and the second circuit, wherein
the first circuit includes:
an input terminal receiving an analog input signal;
a first reference signal generator generating an analog first reference signal; and
a first frequency converter converting a frequency of the analog input signal and a frequency of the analog first reference signal, the transmitter transmits the frequency-converted input signal and the frequency-converted first reference signal from the first circuit to the second circuit, and the second circuit includes:

a second frequency converter converting the frequency of the transmitted input signal and the frequency of the transmitted first reference signal to obtain a restored input signal and a restored first reference signal;

a second reference signal generator generating an analog second reference signal;

a gain calculator calculating a gain to be adjusted of the restored input signal based on the restored first reference signal and the analog second reference signal;

a gain adjustment device adjusting the gain of the restored input signal based on the calculated gain; and an output terminal outputting the gain-adjusted input signal.

2. The electronic circuit according to claim 1, wherein
the second circuit further includes a clock signal generator generating a first clock signal and a second clock signal, the transmitter transmits the first clock signal from the second circuit to the first circuit, the first frequency converter converts the frequency of at least one of the analog input signal and the analog first reference signal, to a frequency corresponding to the first clock signal, and the second frequency converter converts the frequency of at least one of the transmitted input signal and the transmitted first reference signal, to a frequency corresponding to the second clock signal.

3. The electronic circuit according to claim 2, wherein the first frequency converter uses the first clock signal as driving power.

4. The electronic circuit according to claim 2, wherein
the transmitter includes a first insulation element transmitting the frequency-converted input signal and the frequency-converted first reference signal from the first circuit to the second circuit through electromagnetic field coupling, the first frequency converter supplies one of the frequency-converted input signal and the frequency-converted first reference signal to the first insulation element by switching based on the first clock signal, and the second frequency converter identifies whether the signal input to the second frequency converter is the frequency-converted input signal or the frequency-converted first reference signal, based on the second clock signal.

5. The electronic circuit according to claim 2, wherein
the first frequency converter includes:

a first mixer converting the frequency of the analog input signal; and a second mixer converting the frequency of the analog first reference signal, and at least one of the first mixer and the second mixer uses the first clock signal as driving power.

6. The electronic circuit according to claim 2, wherein
the clock signal generator further generates a third clock signal, the transmitter transmits the third clock signal from the second circuit to the first circuit, and the first frequency converter includes:

a first mixer converting the frequency of the analog input signal to the frequency corresponding to the first clock signal; and a second mixer converting the frequency of the analog first reference signal to the frequency corresponding to the third clock signal.

7. The electronic circuit according to claim 6, wherein
the first mixer uses the first clock signal as driving power, and the second mixer uses the third clock signal as driving power.

8. The electronic circuit according to claim 2, wherein
the clock signal generator further generates a fourth clock signal, and the second frequency converter includes:

a third mixer converting the frequency of the transmitted input signal to the frequency corresponding to the second clock signal; and a fourth mixer converting the frequency of the transmitted first reference signal to a frequency corresponding to the fourth clock signal.

9. The electronic circuit according to claim 8, wherein
the third mixer uses the second clock signal as driving power, and the fourth mixer uses the fourth clock signal as driving power.

10. The electronic circuit according to claim 1, wherein
the gain adjustment device includes a clock signal generator generating a first clock signal and a second clock signal, and determines frequencies of the first clock signal and the second clock signal based on the calculated gain, the transmitter transmits the first clock signal from the second circuit to the first circuit, the first frequency converter converts the frequency of at least one of the analog input signal and the analog first reference signal, to a frequency corresponding to the first clock signal, and the second frequency converter converts the frequency of at least one of the transmitted input signal and the transmitted first reference signal, to a frequency corresponding to the second clock signal.

11. The electronic circuit according to claim 1, wherein
the transmitter includes:

a first insulation element transmitting the frequency-converted input signal from the first circuit to the second circuit through electromagnetic field coupling; and a second insulation element transmitting the frequency-converted first reference signal from the first circuit to the second circuit through electromagnetic field coupling.

12. The electronic circuit according to claim 1, wherein
the first frequency converter includes:

a first mixer converting the frequency of the analog input signal; and a second mixer converting the frequency of the analog first reference signal.

13. The electronic circuit according to claim 1, wherein
the second frequency converter includes:

a third mixer converting the frequency of the transmitted input signal to obtain the restored input signal; and a fourth mixer converting the frequency of the transmitted first reference signal to obtain the restored first reference signal.

14. The electronic circuit according to claim 1, wherein the transmitter transmits the signals between the first circuit and the second circuit by using at least one of a capacitor and a transformer.

15. The electronic circuit according to claim 1, further comprising a first chip and a second chip, wherein
the first circuit is disposed on the first chip, and
the second circuit is disposed on the second chip.

16. The electronic circuit according to claim 1, wherein the first reference signal generator uses the signal transmitted from the second circuit to the first circuit through the transmitter, as driving power.

17. The electronic circuit according to claim 1, wherein
the first reference signal generator further generates an analog third reference signal,
the first frequency converter converts a frequency of the analog third reference signal,
the transmitter transmits the frequency-converted third reference signal from the first circuit to the second circuit,
the second frequency converter converts the frequency of the transmitted third reference signal to obtain a restored third reference signal,
the second circuit further includes a fourth reference signal generator generating a fourth reference signal having a temperature coefficient less than a predetermined value, based on the restored third reference signal and the restored first reference signal, and
the gain calculator calculates the gain to be adjusted of the restored input signal, based on the fourth reference signal and the analog second reference signal.

18. The electronic circuit according to claim 17, wherein
the first reference signal generator includes:
a first element that is a diode or a bipolar transistor; and
a second element that is a diode or a bipolar transistor,
the first element and the second element are connected in series,
the first reference signal is generated based on a voltage between both ends of the first element, and
the third reference signal is generated based on a voltage between both ends of the second element.

19. The electronic circuit according to claim 1, wherein
at least one of the first circuit and the second circuit further includes an oscillator,
at least one of the first reference signal generator and the second reference signal generator includes a plurality of elements, and
at least one of the plurality of elements perform intermittent operation based on an output signal of the oscillator.

20. An electronic apparatus, comprising:
a resistor;
the electronic circuit according to claim 1, the electronic circuit acquiring a current flowing through the resistor as the input signal; and
a converter configured to convert a signal from the output terminal into a digital signal.

* * * * *